United States Patent
Park et al.

(10) Patent No.: US 10,373,825 B1
(45) Date of Patent: Aug. 6, 2019

(54) METHOD FOR MANUFACTURING GALLIUM NITRIDE SUBSTRATE USING CORE-SHELL NANOPARTICLE

(71) Applicant: Industry-University Cooperation Foundation Hanyang University, Seoul (KR)

(72) Inventors: Jea Gun Park, Seongnam-si (KR); Tae Hun Shim, Suwon-si (KR); Jae Hyoung Shim, Seoul (KR); Il Hwan Kim, Gangneung-si (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 15/991,464

(22) Filed: May 29, 2018

(51) Int. Cl.
*H01L 21/02* (2006.01)
*H01L 21/683* (2006.01)

(52) U.S. Cl.
CPC .... *H01L 21/02639* (2013.01); *H01L 21/0242* (2013.01); *H01L 21/0254* (2013.01); *H01L 21/0262* (2013.01); *H01L 21/02458* (2013.01); *H01L 21/02488* (2013.01); *H01L 21/02502* (2013.01); *H01L 21/02601* (2013.01);
(Continued)

(58) Field of Classification Search
CPC ......... H01L 21/02389; H01L 21/02458; H01L 21/02488; H01L 21/02502; H01L 21/02505; H01L 21/0254; H01L 21/02601; H01L 21/0262; H01L 21/02639; H01L 21/02642; H01L 21/6835;
(Continued)

(56) References Cited

U.S. PATENT DOCUMENTS 7,888,857 B2 * 2/2011 Choi .................. B82Y 20/00
257/13
9,079,244 B2 * 7/2015 Choi .................. B22F 1/0088
(Continued)

FOREIGN PATENT DOCUMENTS

| JP | 2007-001855 A | 1/2007 |
| KR | 10-0712753 B1 | 4/2007 |
| KR | 10-1509309 B1 | 4/2015 |

OTHER PUBLICATIONS

Young Jae Park et al., "Selective Defect Blocking by Self-Assembled Silica Nanospheres for High Quality GaN Template", Electrochemical and Solid-State Letters, 2010, p. H287-H289, vol. 13, Issue 8.
(Continued)

*Primary Examiner* — Stephen W Smoot
(74) *Attorney, Agent, or Firm* — Sughrue Mion, PLLC

(57) ABSTRACT

Disclosed is a method of fabricating a gallium nitride substrate using nanoparticles with a core-shell structure. A method of fabricating a gallium nitride substrate using nanoparticles with a core-shell structure according to an embodiment of the present disclosure includes a step of coating nanoparticles with a core-shell structure on a temporary substrate to form at least one nanoparticle layer; a step of allowing a pit gallium nitride (pit GaN) layer to grow on the temporary substrate; a step of allowing a mirror GaN layer (mirror GaN) to grow on the pit GaN layer; and a step of separating the temporary substrate, wherein each of the nanoparticles with a core-shell structure includes a core and an ionic polymer shell coated on a surface of the core surface.

12 Claims, 17 Drawing Sheets

(52) U.S. Cl.
CPC ............................. *H01L 21/02634* (2013.01);
*H01L 21/02642* (2013.01); *H01L 21/02658*
(2013.01); *H01L 21/6835* (2013.01); *H01L 2221/6835* (2013.01); *H01L 2221/68318*
(2013.01); *H01L 2221/68345* (2013.01)

(58) Field of Classification Search
CPC ........... H01L 2221/68318; H01L 2221/68345; H01L 2221/6835; Y10S 977/773
See application file for complete search history.

(56) References Cited

U.S. PATENT DOCUMENTS

| | | | |
|---|---|---|---|
| 2009/0117675 A1 | 5/2009 | Yamanaka et al. | |
| 2011/0156214 A1 | 6/2011 | Yoon et al. | |
| 2012/0043532 A1* | 2/2012 | Yasuda | B82Y 20/00 257/40 |
| 2014/0008676 A1* | 1/2014 | Wang | H01L 51/5262 257/98 |
| 2015/0035554 A1* | 2/2015 | Dang | B23K 26/36 324/756.01 |

OTHER PUBLICATIONS

Sung Jin an et al., "Heteroepitaxial Growth of High-Quality GaN Thin Films on Si Substrates Coated with Self-Assembled Sub-micrometer-sized Silica Balls", Advanced Materials, 2006, pp. 2833-2836, vol. 18.

Yang Hu et al., Preparation and characterization of cationic pH-sensitive $SiO_2$/polymer core-shell nanoparticles with amino groups in the shell, Colloid Polym Sci (2014), 292:2611-2620.

Rajib Ghosh Chaudhuri et al., "Core/Shell Nanoparticles: Classes, Properties, Synthesis Mechanisms, Characterization, and Applications", Chemical Reviews, 2012, 112, 2373-2433.

Office Action issued in the German Patent Office, in corresponding German Patent Application No. 10 2018 213 419.7 dated Apr. 15, 2019.

* cited by examiner

[FIG. 1A]
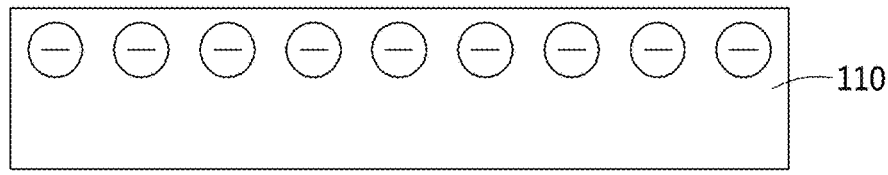
[FIG. 1B]
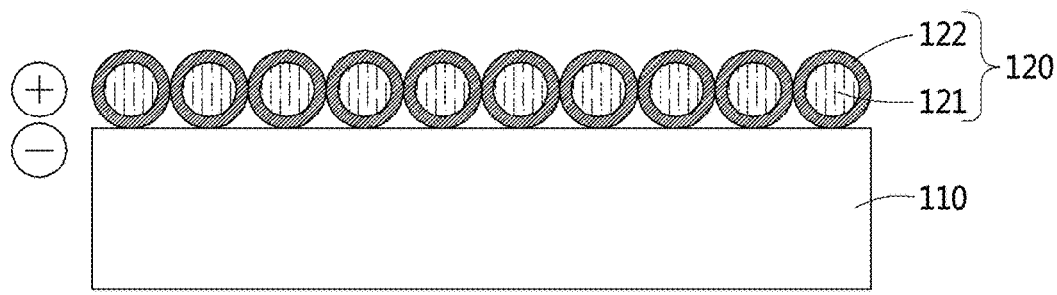
[FIG. 1C]
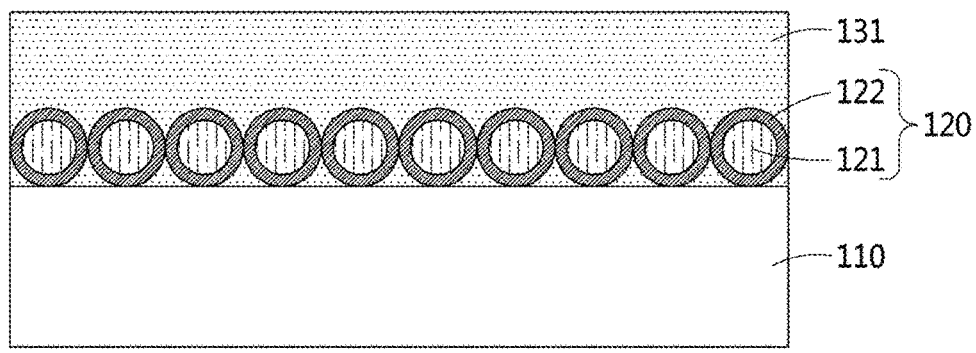

[FIG. 1D]
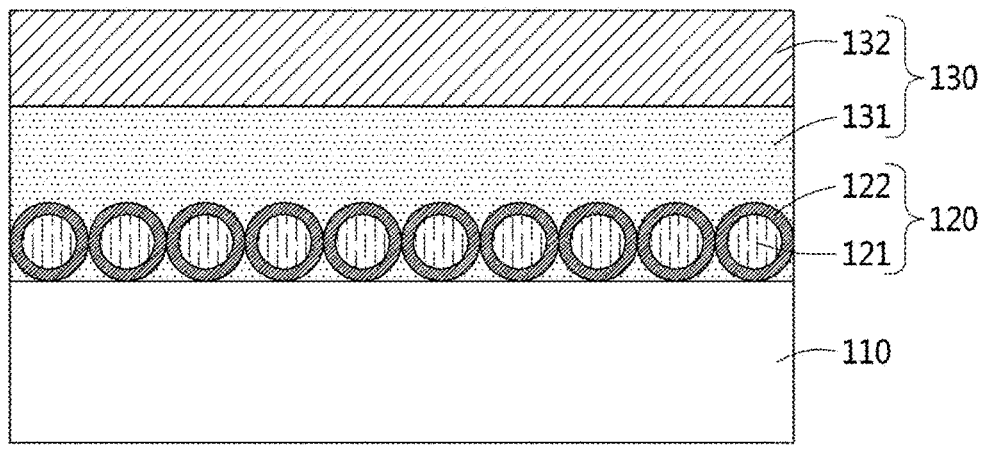
[FIG. 1E]
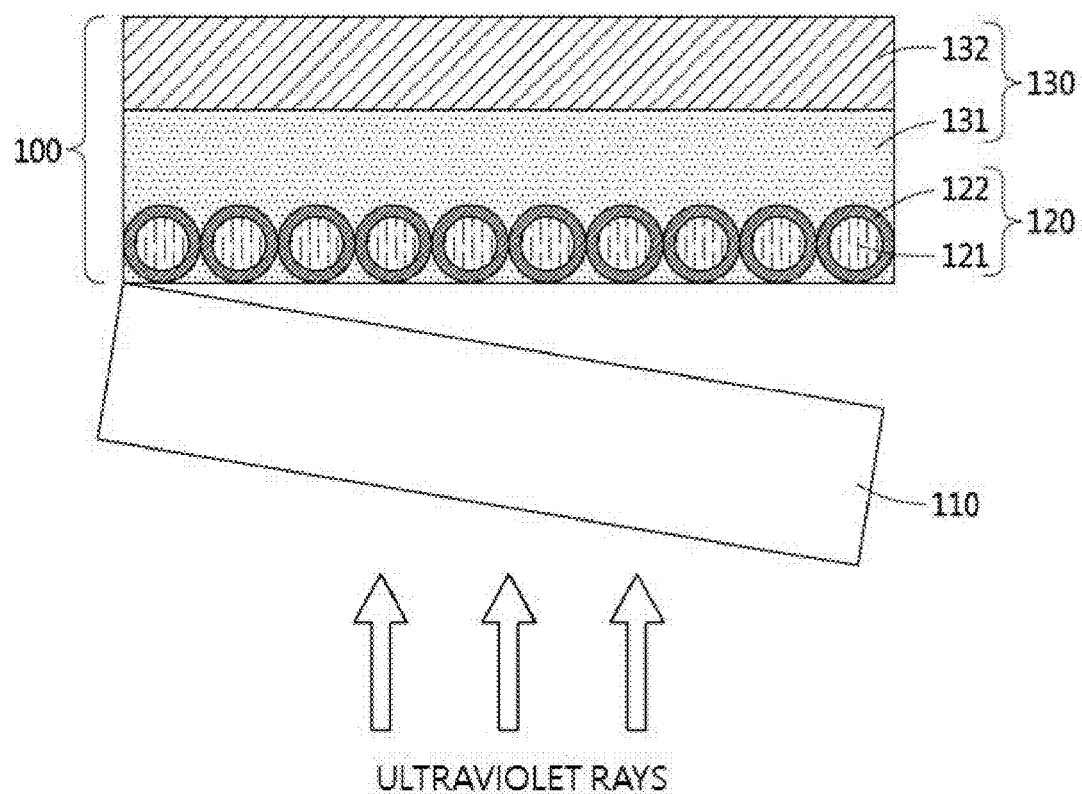
ULTRAVIOLET RAYS

[FIG. 1F]
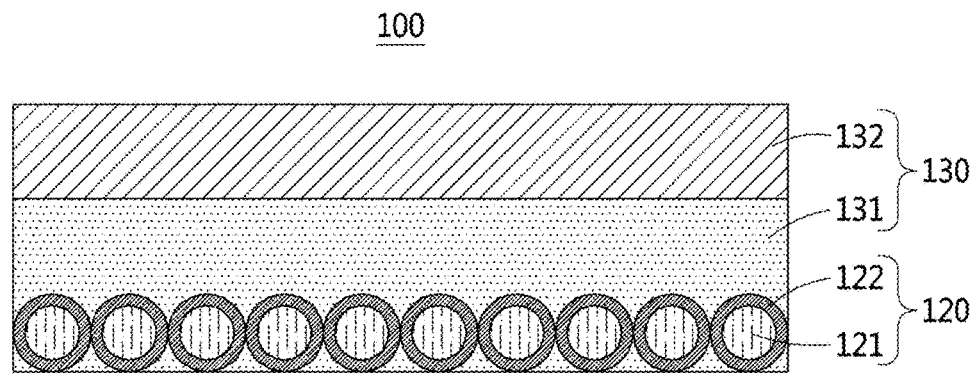
[FIG. 2]
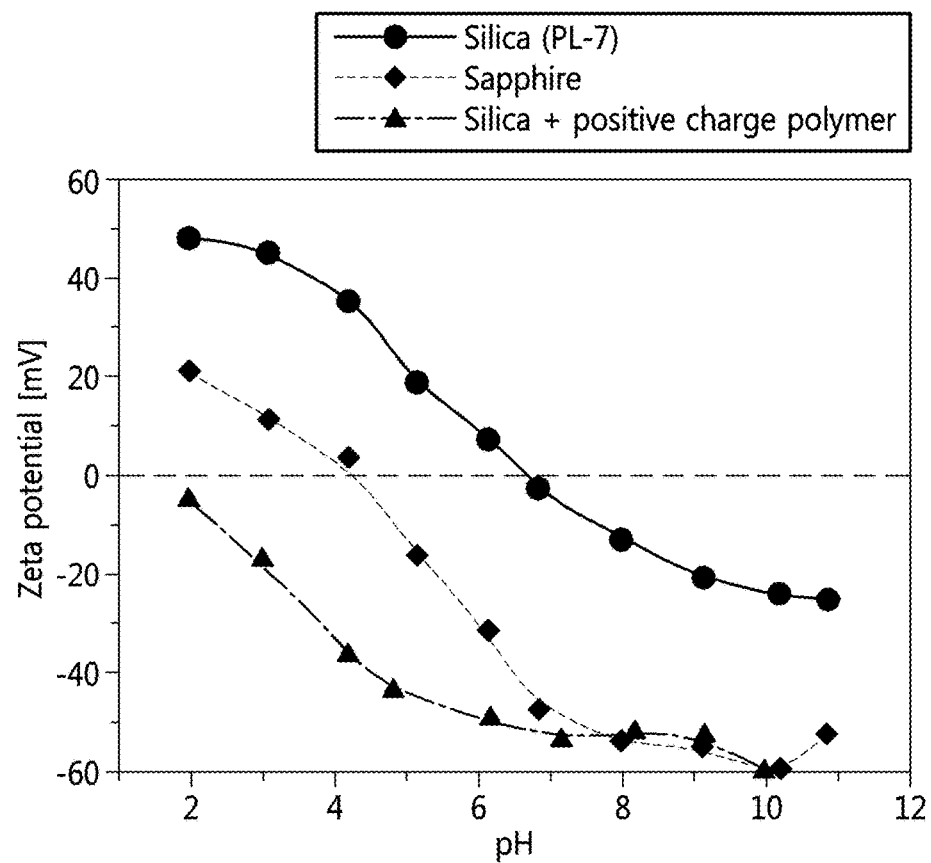

[FIG. 3A]
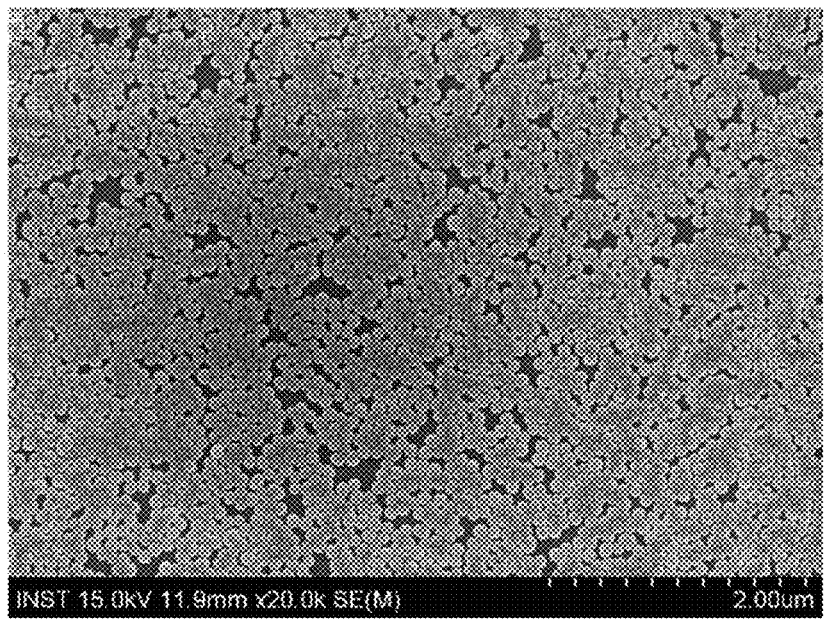
[FIG. 3B]
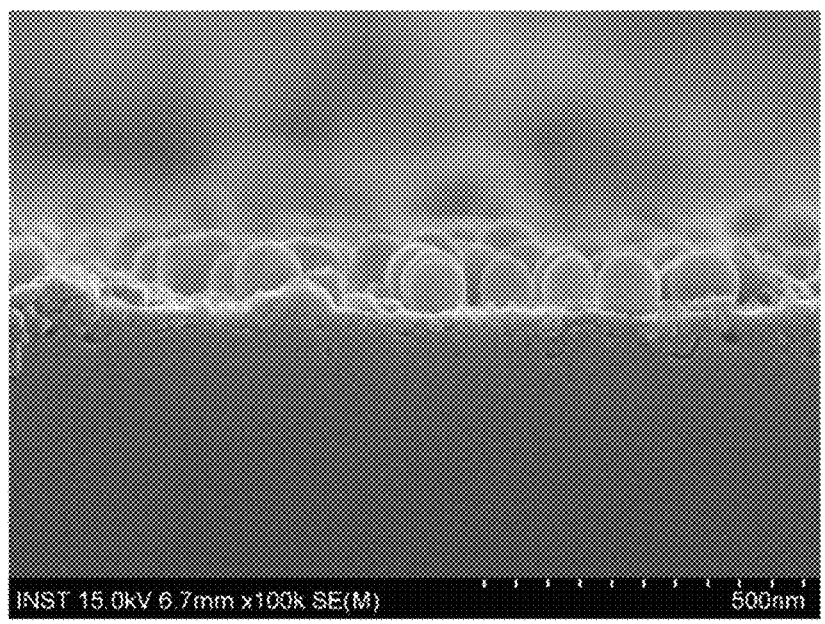

【FIG. 3C】
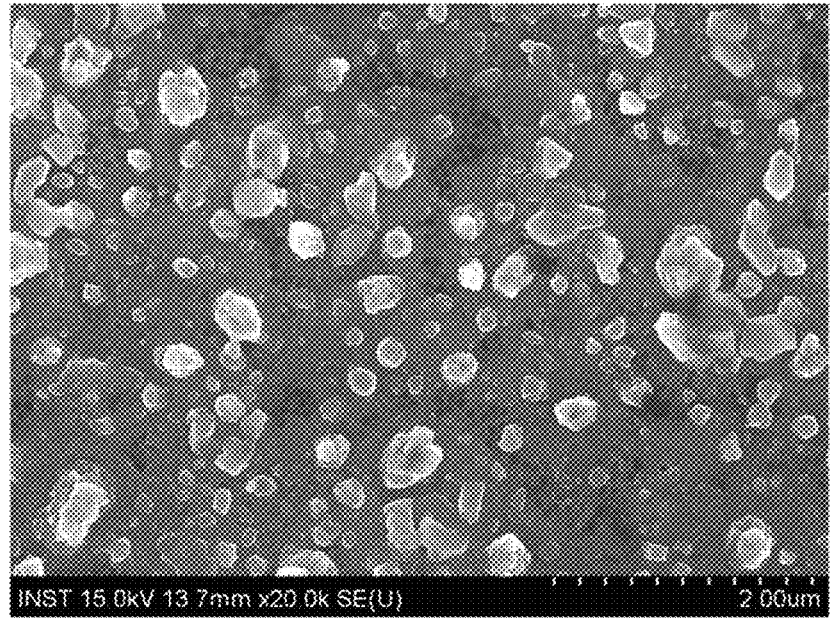
【FIG. 4A】
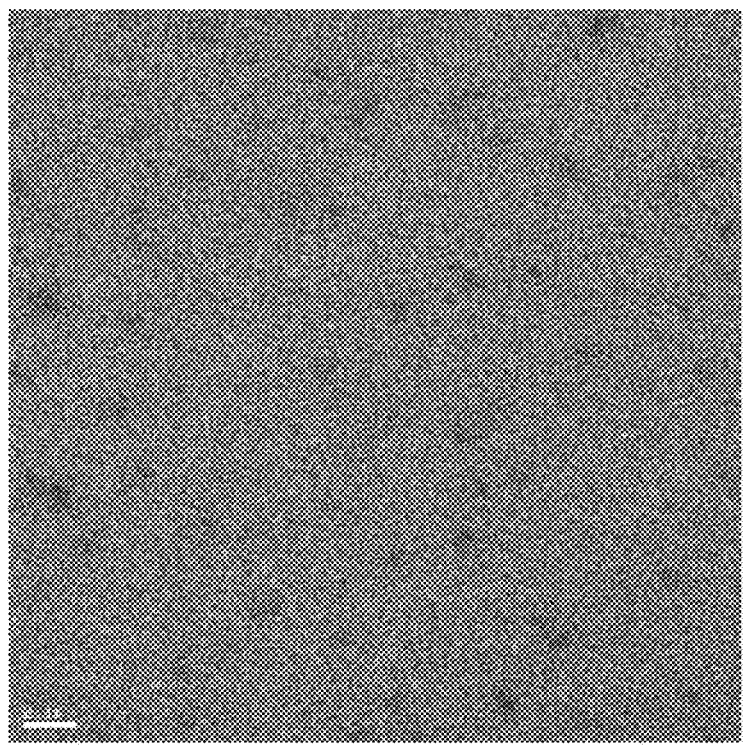

[FIG. 4B]
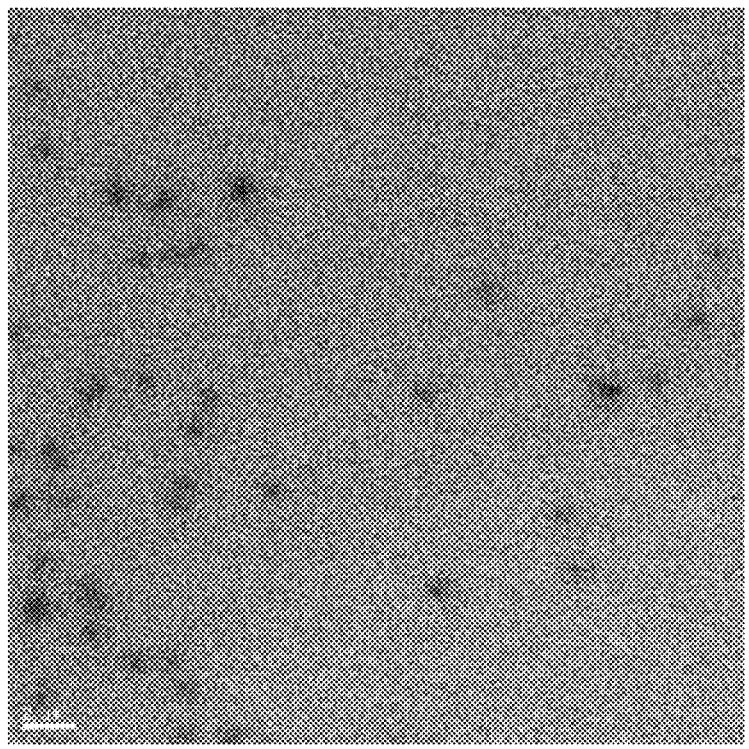
[FIG. 5A]
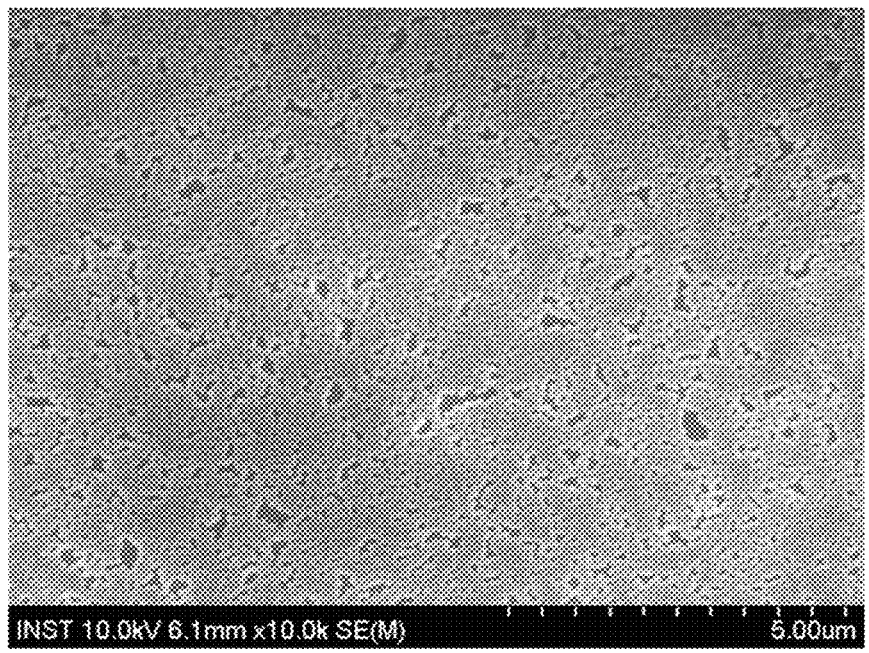

[FIG. 5B]
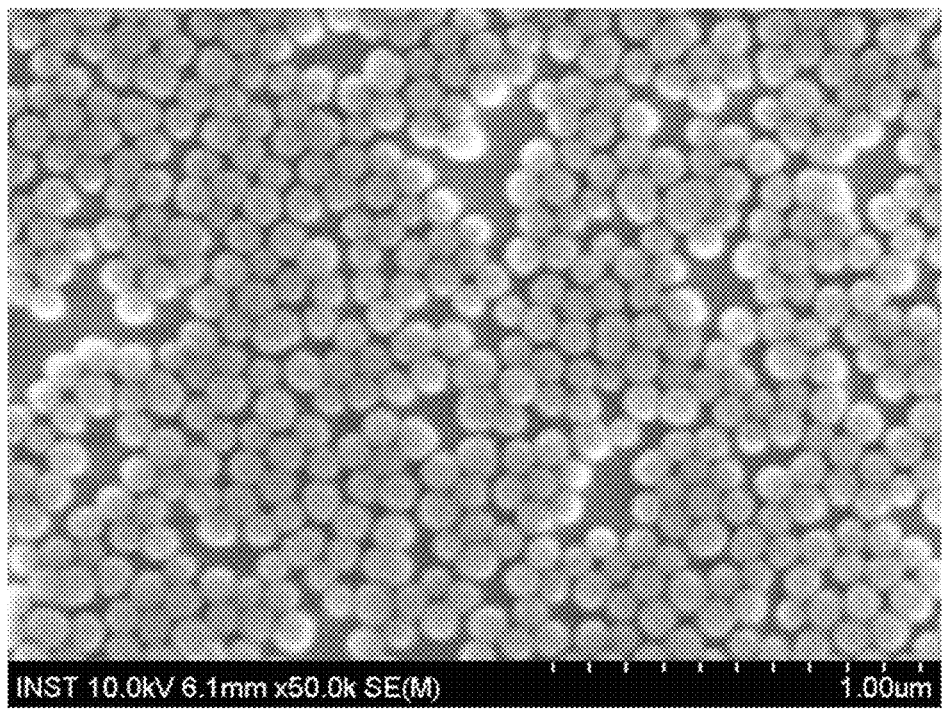
[FIG. 5C]
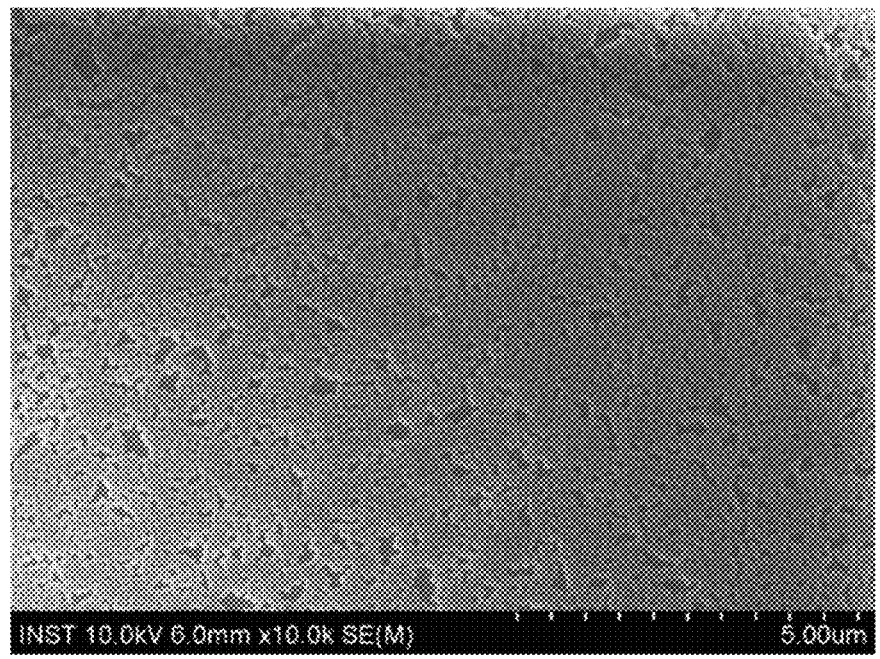

[FIG. 5D]
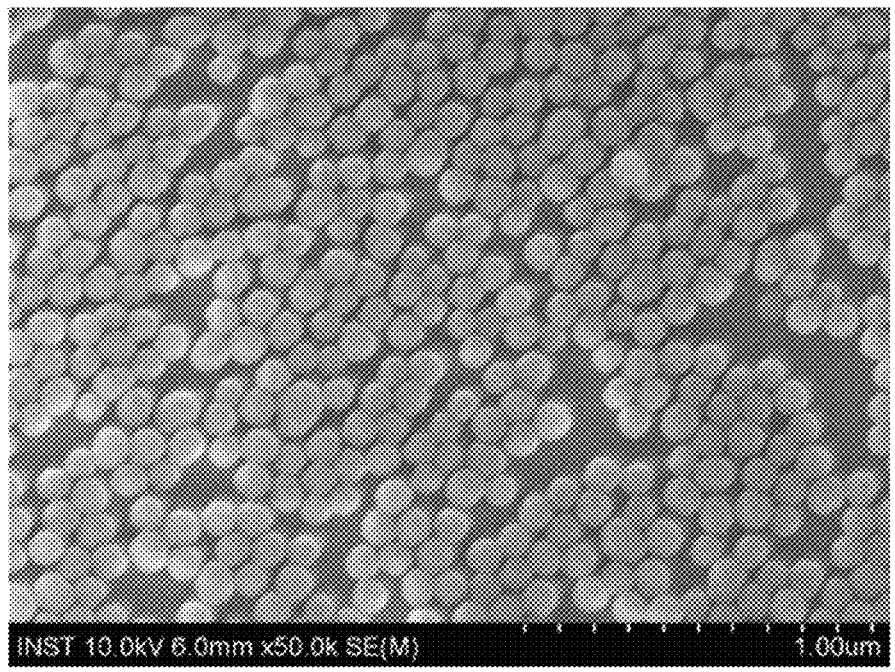
[FIG. 6A]
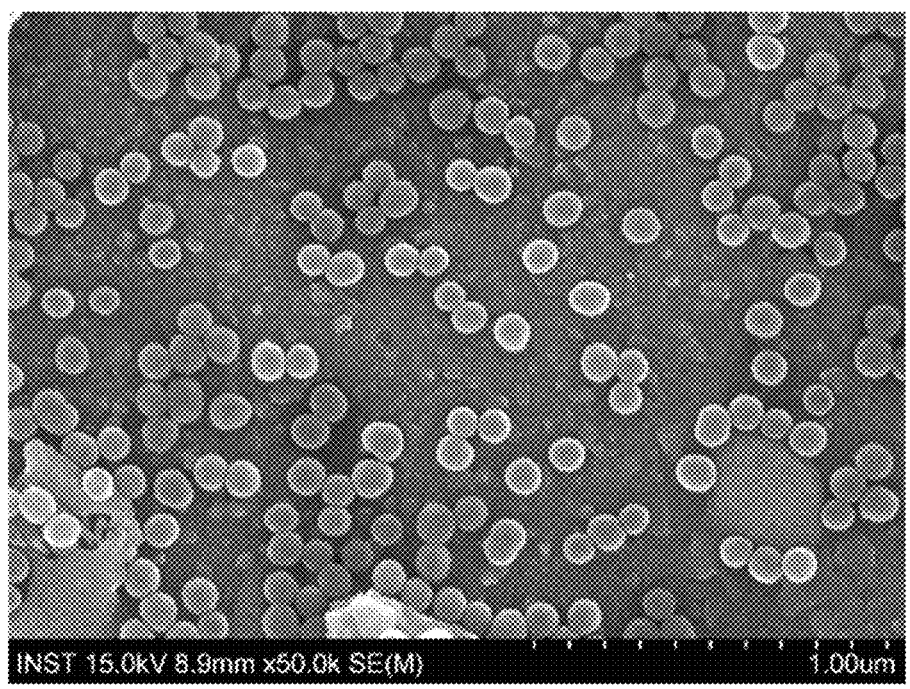

【FIG. 6B】
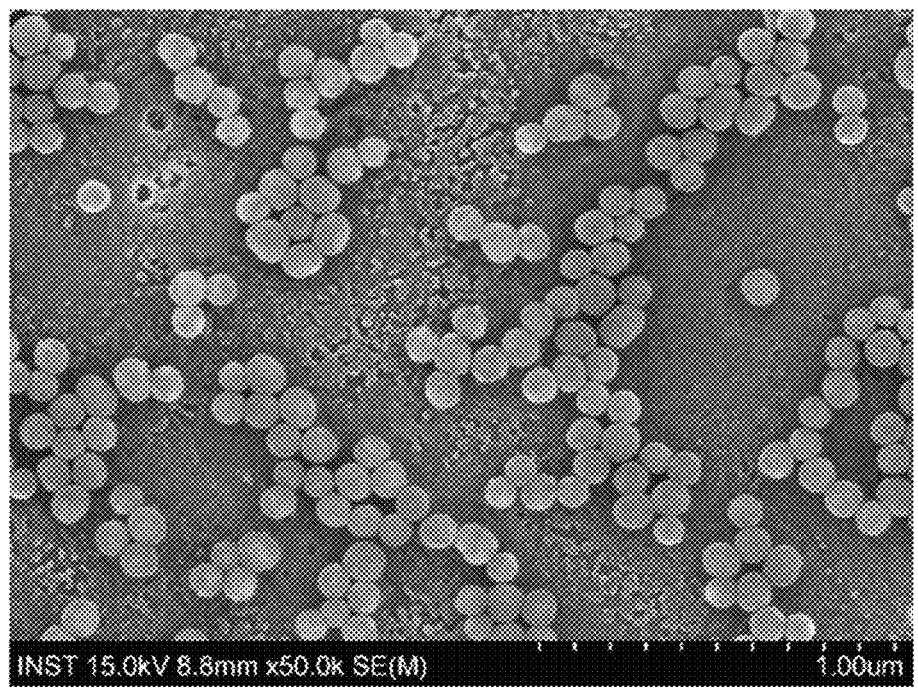
【FIG. 6C】
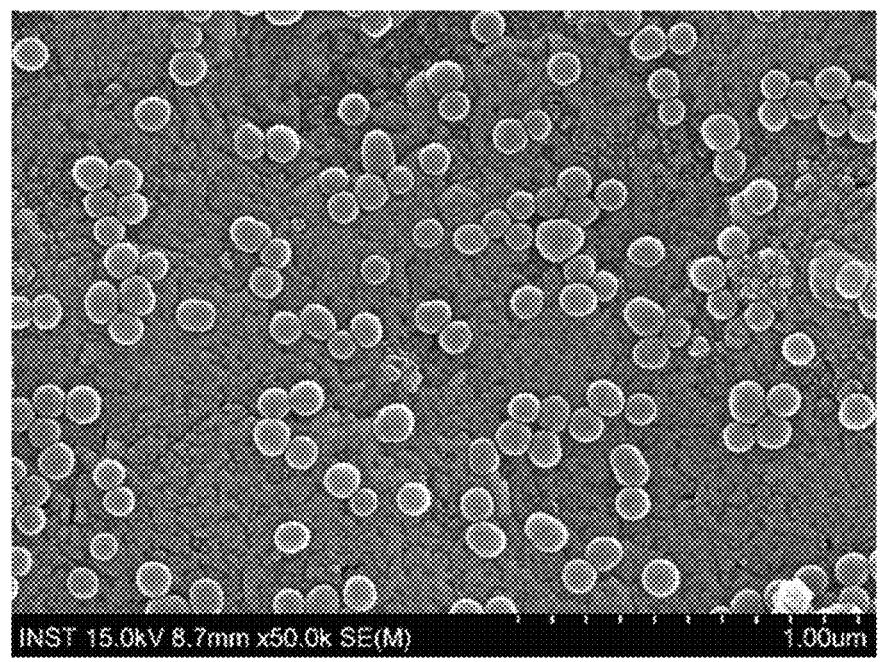

[FIG. 7A]
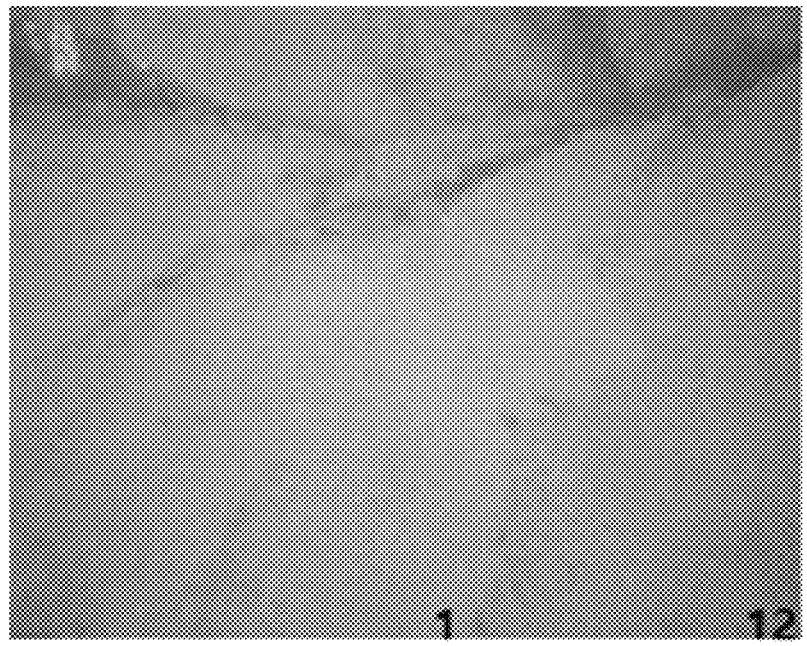
[FIG. 7B]
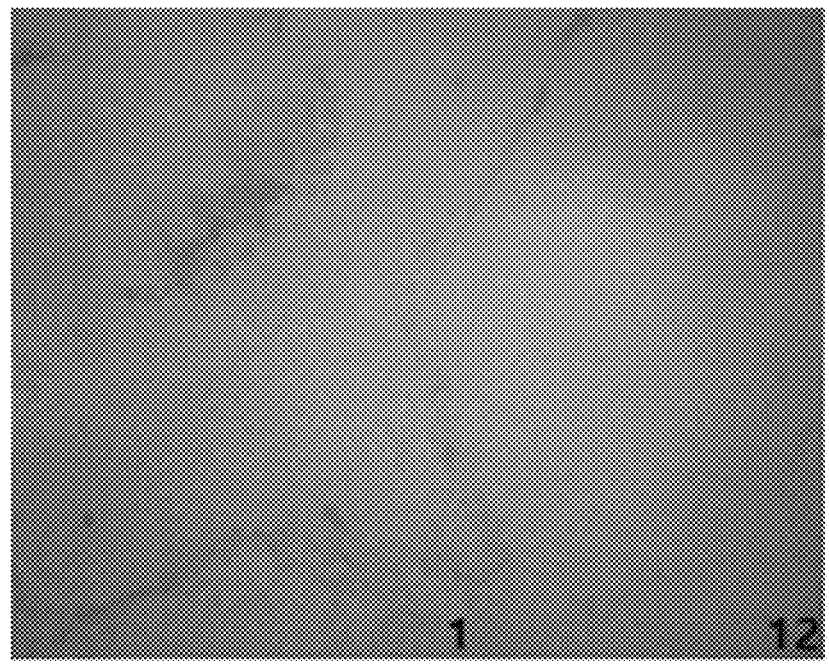

[FIG. 7C]
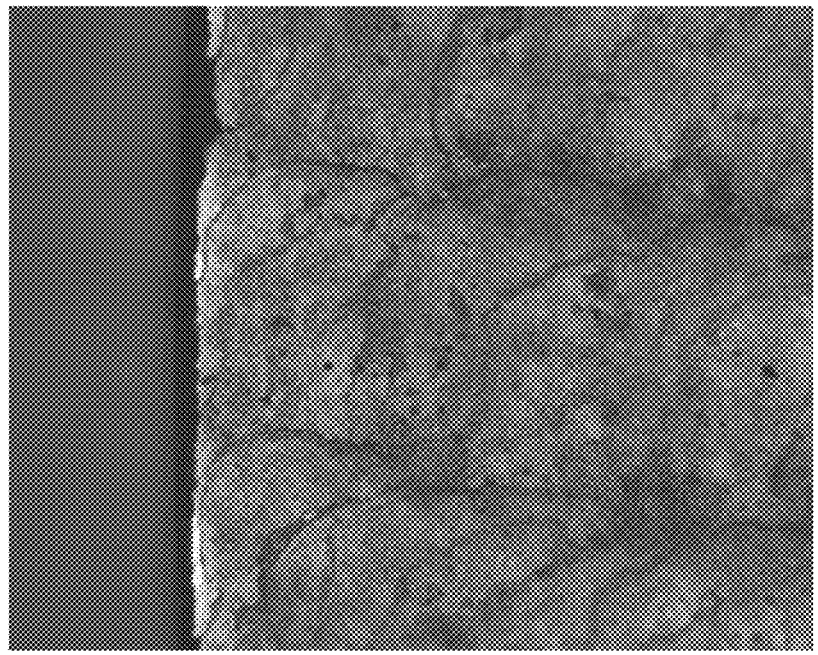
[FIG. 7D]
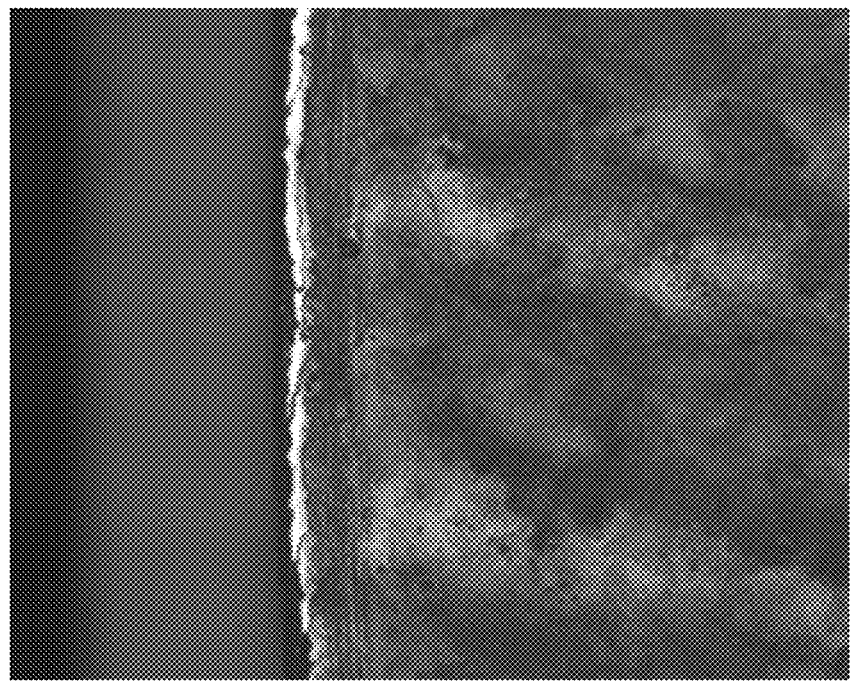

[FIG. 8A]
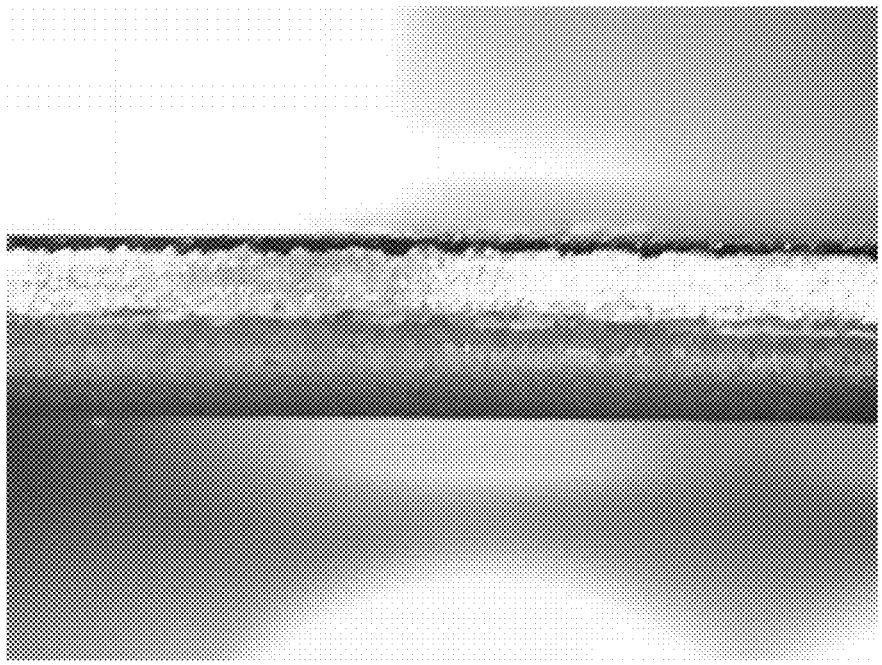
[FIG. 8B]
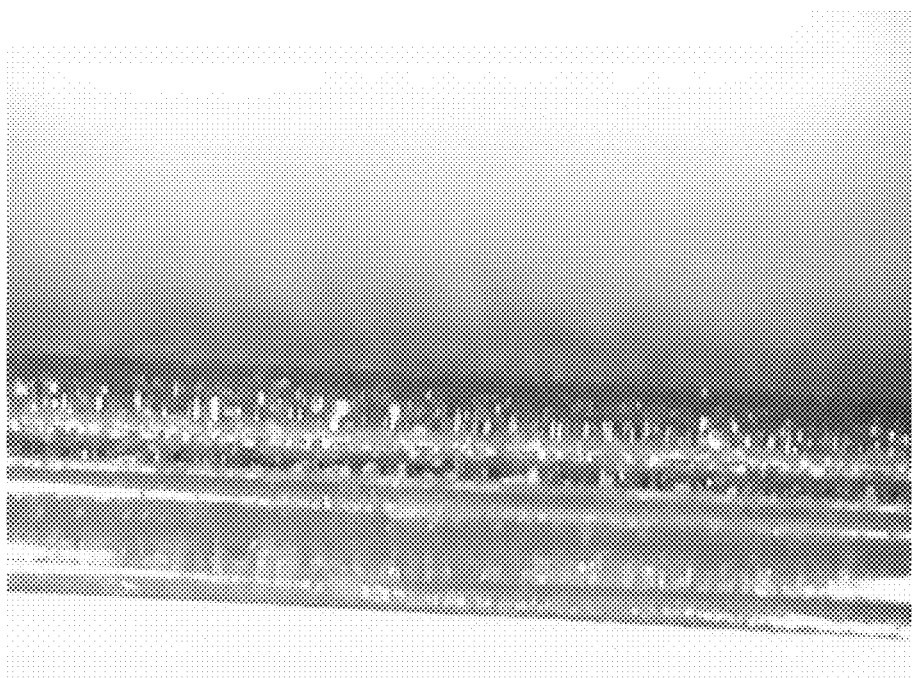

[FIG. 8C]
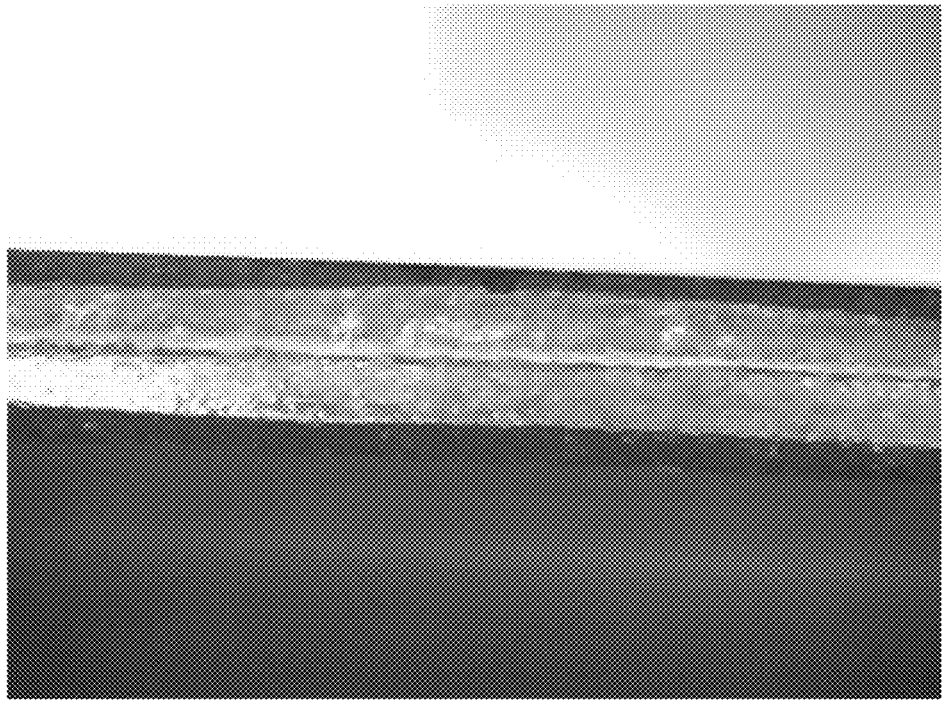
[FIG. 8D]
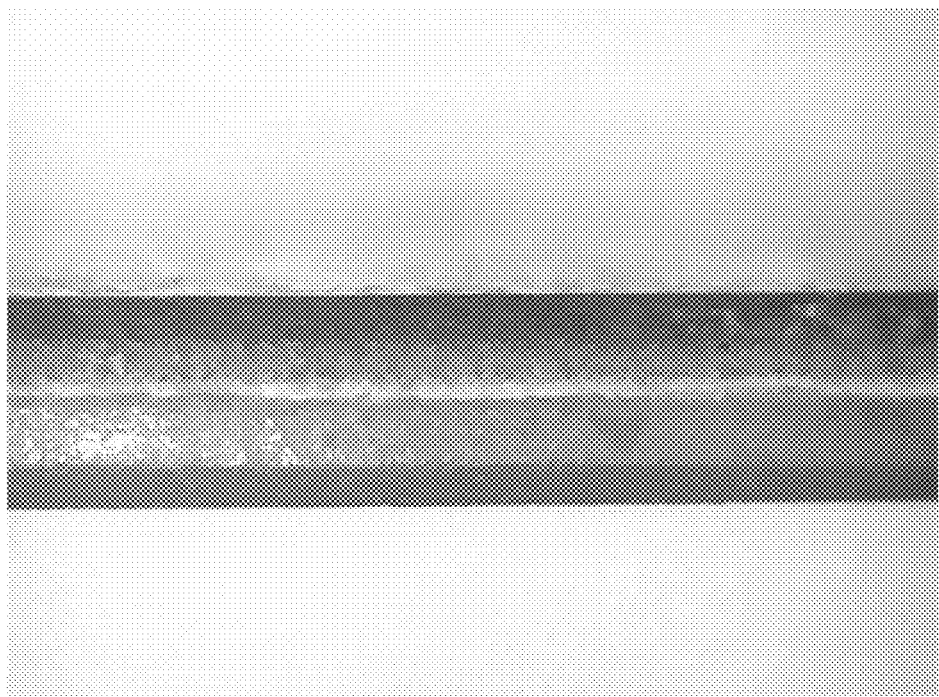

[FIG. 9A]
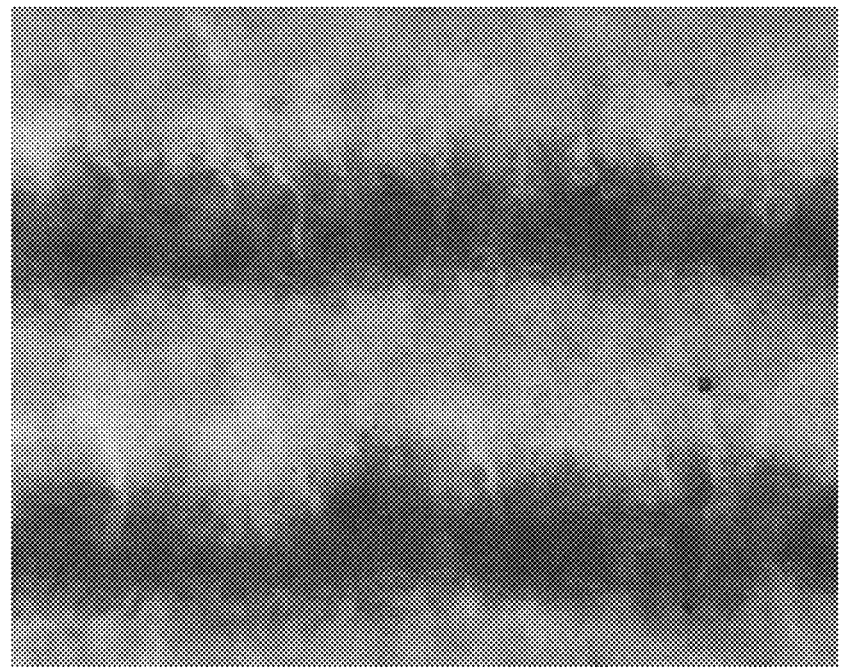
[FIG. 9B]
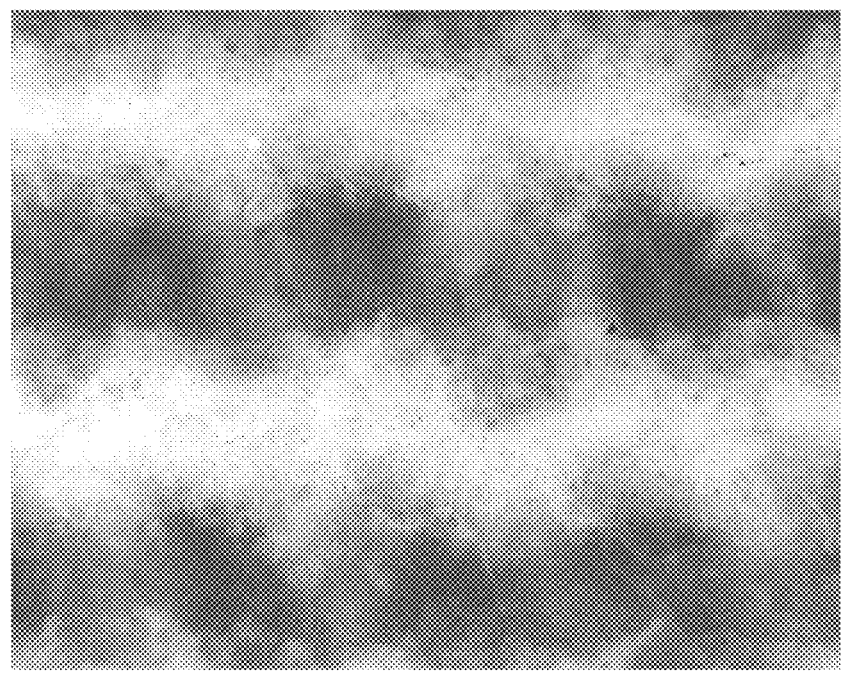

[FIG. 10A]
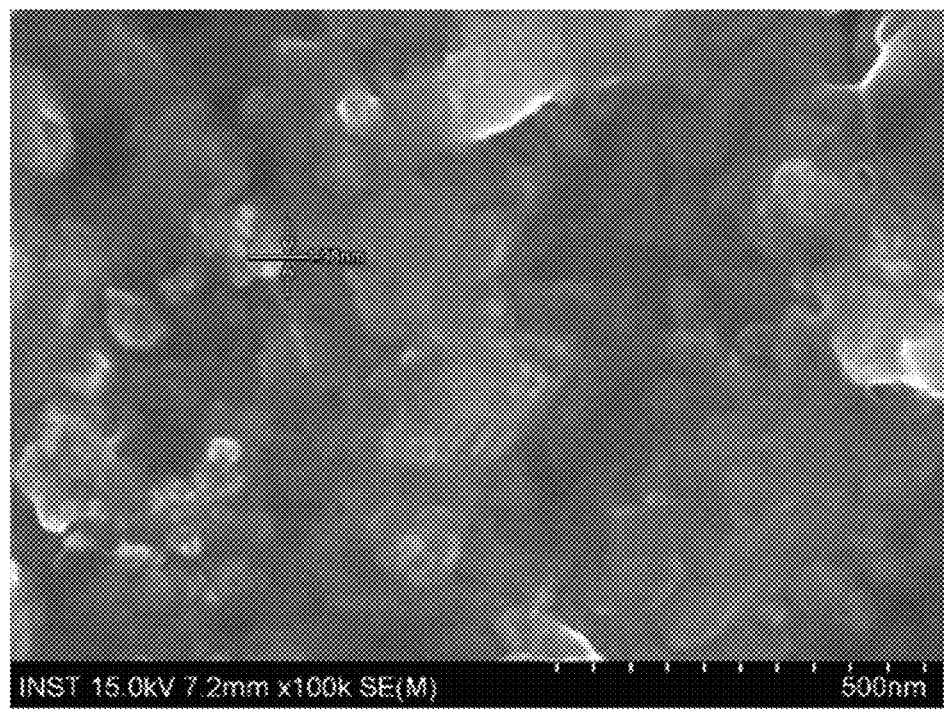
[FIG. 10B]
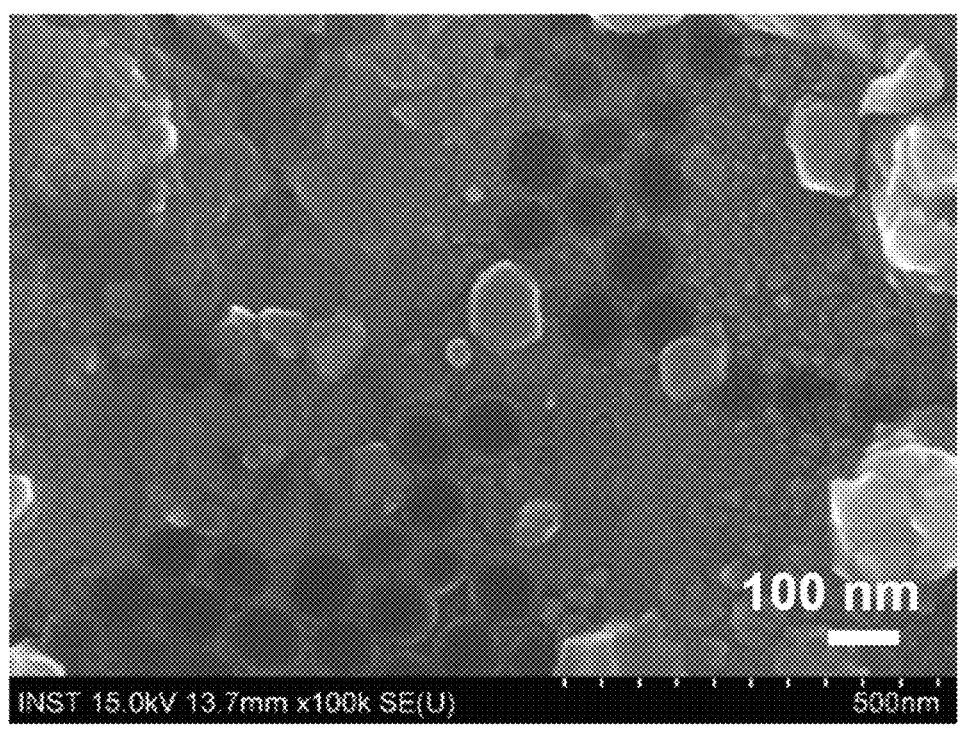

[FIG. 11A]
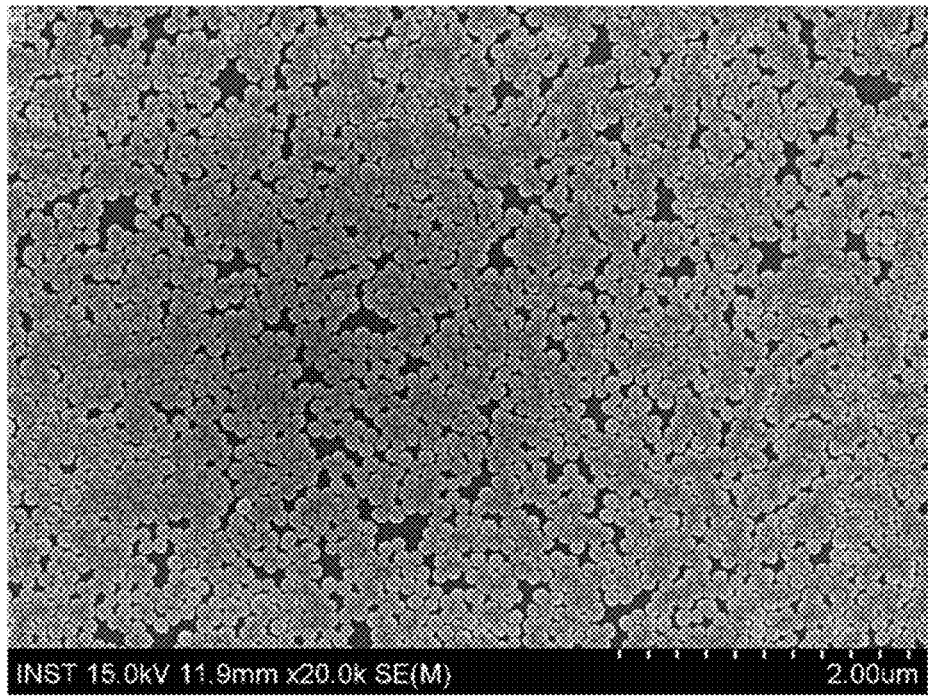
[FIG. 11B]
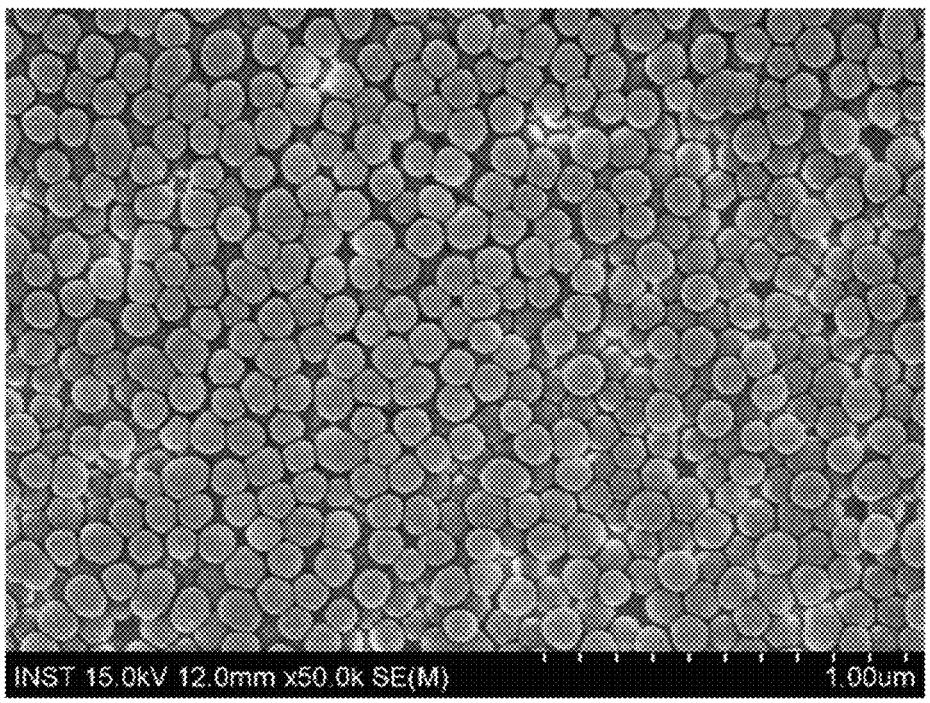

[FIG. 11C]
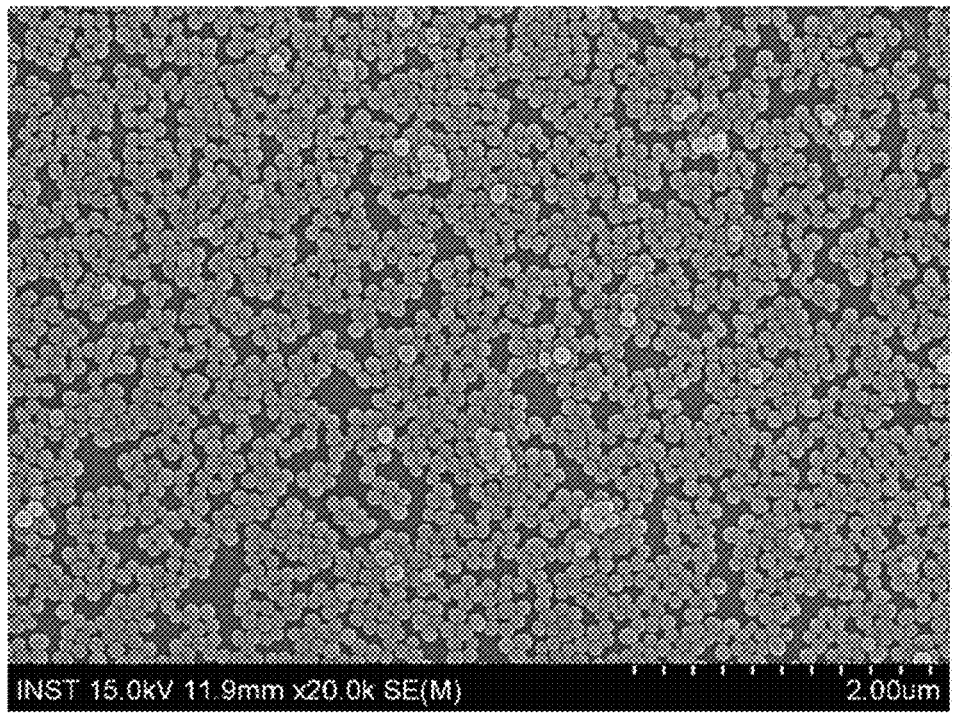
[FIG. 11D]
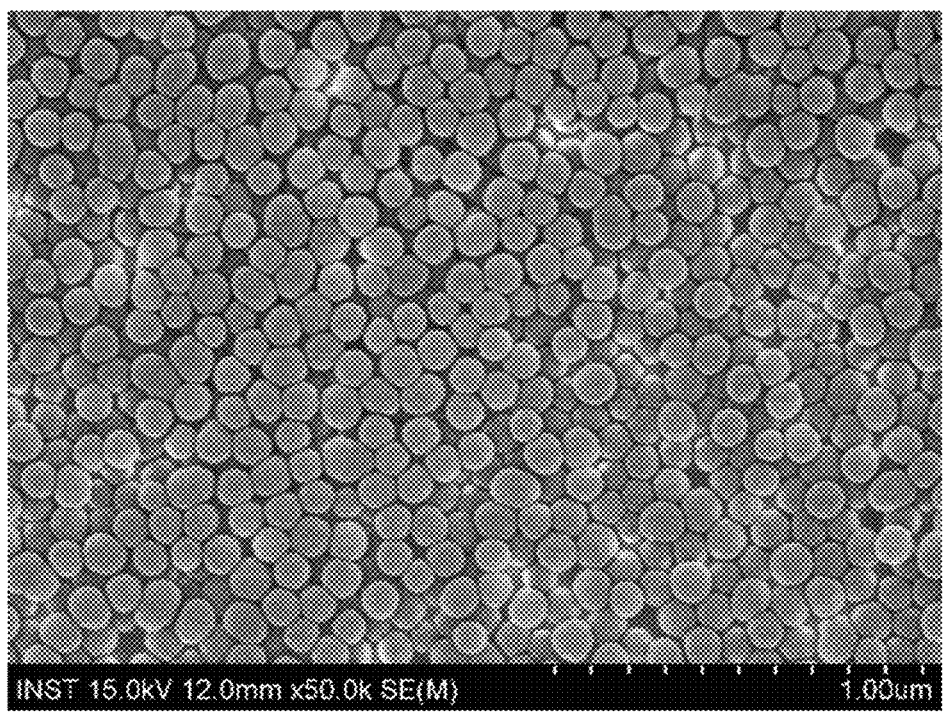

METHOD FOR MANUFACTURING GALLIUM NITRIDE SUBSTRATE USING CORE-SHELL NANOPARTICLE

BACKGROUND OF THE DISCLOSURE

Field of the Disclosure

The present disclosure relates to a method of fabricating a gallium nitride substrate using nanoparticles with a core-shell structure, and more particularly, to a method of fabricating a gallium nitride substrate having high quality and low defect density by evenly coating nanoparticles with a core-shell structure on a temporary substrate.

Description of the Related Art

The performance and lifespan of semiconductor devices, such as laser diodes and light emitting diodes, are determined by various factors constituting the device, and are particularly affected by a base substrate on which elements are stacked. Several methods of fabricating a high quality semiconductor substrate have been proposed.

A gallium nitride (GaN) substrate is a typical group III-V compound semiconductor substrate. In addition to a GaAs substrate and an InP substrate, the GaN substrate is suitably used for a semiconductor device. However, the fabrication costs of the GaN substrate are much higher than those of the GaAs substrate or the InP substrate.

Demand for group III-V compound semiconductor substrates is gradually increasing, and various methods are used to increase the efficiency of light emitting devices. In recent years, an epitaxial lateral overgrowth (ELO) method, which determines internal quantum efficiency, is widely used to fabricate a high-quality nitride semiconductor thin film.

The ELO method is characterized by reducing stress caused by a difference in lattice constant and coefficient of thermal expansion between a temporary substrate and GaN crystals by using a stripe-type $SiO_2$ mask.

The ELO method is characterized in that a GaN thin film is grown on a temporary substrate, the GaN thin film-grown substrate is removed from a reactor and then placed in an evaporator to form a $SiO_2$ thin film on the GaN thin film, the $SiO_2$ thin film-deposited substrate is removed from the evaporator, and a $SiO_2$ mask pattern is formed on the $SiO_2$ thin film-deposited substrate using a photolithography technique, followed by introducing the $SiO_2$ mask pattern-formed substrate to the reactor to form a GaN thin film thereon. Such an ELO method is disadvantageous in that complicated processes are preformed and long fabrication time is taken.

To address these problems, Korean Patent No. 10-0712753 has proposed a technique capable of simplifying a fabrication process by coating a temporary substrate with spherical balls and allowing a GaN thin film to selectively grow on the spherical ball-coated substrate.

In addition, Japanese Patent Application Publication No. 2007-001855 has proposed a technique capable of fabricating a high-quality self-supporting GaN substrate by forming inorganic particles on a temporary substrate and then selectively allowing a GaN thin film to grow thereon.

Further, S. J. An has proposed a technique capable of simplifying a growth process by forming micro-scale silica balls on a silicon substrate and then allowing GaN to grow thereon.

However, these conventional methods are disadvantageous in that, since inorganic particles are not evenly coated on a temporary substrate and are concentrated at both sides of the temporary substrate upon coating the temporary substrate with the inorganic particles, defects of a GaN thin film increase during growth of the GaN thin film and a non-uniform GaN thin film is formed.

In addition, Young Jae Park has proposed a GaN growth technique characterized by allowing GaN to grow on a temporary substrate and then forming etched pits thereon, followed by coating the etched pits with silica and then allowing GaN to grow thereon.

However, this method may cause GaN damage due to excessive etching and GaN yield decrease due to increased process frequencies and difficulty, because an etching process is performed after growth of GaN.

RELATED DOCUMENTS

Patent Documents

Korean Patent No. 10-0712753 entitled "COMPOUND SEMICONDUCTOR DEVICE AND METHOD OF FABRICATING THE SAME"

Japanese Patent Application Publication No. 2007-001855, entitled "GROUP III-V NITRIDE-LAMINATED SEMICONDUCTOR SUBSTRATE, METHOD OF FABRICATING SELF-SUPPORTING GROUP III-V NITRIDE SEMICONDUCTOR-LAMINATED SUBSTRATE, AND SEMICONDUCTOR DEVICE"

Korean Patent No. 10-1509309 entitled "GALLIUM NITRIDE SUBSTRATE CONTAINING LATTICE PARAMETER-CHANGING ELEMENT"

Non-Patent Documents

Young Jae Park, et al., 10, 2010, SELECTIVE DEFECT BLOCKING BY SELF-ASSEMBLED SILICA NANOSPHERES FOR HIGH QUALITY GAN TEMPLATE S. J. An et al., 4, 2006, HETEROEPITAXIAL GROWTH OF HIGH-QUALITY GAN THIN FILMS ON SI SUBSTRATES COATED WITH SELF-ASSEMBLED SUB-MICROMETER-SIZED SILICA BALLS

SUMMARY OF THE DISCLOSURE

Therefore, the present disclosure has been made in view of the above problems, and it is one object of the present disclosure to provide a method of fabricating a gallium nitride substrate capable of simplifying a growth process and shortening a gallium nitride layer growth time by allowing a gallium nitride layer to selectively grow on a temporary substrate using nanoparticles with a core-shell structure.

It is still another object of the present disclosure to provide a method of fabricating a gallium nitride substrate capable of lowering a defect density of a grown gallium nitride layer by allowing a gallium nitride layer to selectively grow on a temporary substrate using nanoparticles with a core-shell structure.

It is still another object of the present disclosure to provide a method of fabricating a gallium nitride substrate capable of evenly coating nanoparticles with a core-shell structure on a temporary substrate.

It is still another object of the present disclosure to provide a method of fabricating a gallium nitride substrate evenly coated with nanoparticles with a core-shell structure by controlling the zeta potential of the nanoparticles using an ionic polymer shell.

It is yet another object of the present disclosure to provide a method of fabricating a gallium nitride substrate capable of reducing fabrication costs and time by coating nanoparticles with a core-shell structure on a temporary substrate using spin coating and thus simplifying a coating process.

In accordance with an aspect of the present disclosure, the above and other objects can be accomplished by the provision of a method of fabricating a gallium nitride substrate, the method including coating nanoparticles with a core-shell structure on a temporary substrate to form at least one nanoparticle layer; allowing a pit gallium nitride (pit GaN) layer to grow on the temporary substrate; allowing a mirror GaN layer (mirror GaN) to grow on the pit GaN layer; and separating the temporary substrate, wherein each of the nanoparticles with a core-shell structure includes a core and an ionic polymer shell coated on a surface of the core surface.

A zeta potential of the nanoparticles with a core-shell structure may be controlled by the shell.

The nanoparticles with a core-shell structure may have a zeta potential opposite to that of the temporary substrate.

The ionic polymer shell may be made of a cationic polymer material, the cationic polymer material including at least one of poly(diallyldimethylammonium chloride) (PDDA), polyethyleneimine (PEI), polyaniline (PANI), polyallylamine hydrochloride (PAH), polyacrylamide (PAA), polyvinylimidazole, polyamidoamine (PAMAM), polymethacryloxyethyltrialkyl ammonium halide, polyallylamine chloride, aminoethylated polyacrylamide, polyvinylamine, Hoffman-degradated polyacrylamide, and polyethyleamine.

The ionic polymer shell may be made of an anionic polymer material, the anionic polymer material including at least one of polyacrylic acid, polymethacrylic acid, polystyrene (PS), polysulfonic acid, a polyacrylamide/acrylic acid copolymer, a polyacrylic acid/sulfonic acid copolymer, a polysulfonic acid/acrylamide copolymer, a polyacrylic acid/malonic acid copolymer, and a polystyrene/acrylic acid copolymer.

The core may include at least one of $SiO_2$, $Al_2O_3$, $TiO_2$, $ZrO_2$, $CrO_2$, W, Re, Mo, Cr, Co, Si, Au, Zr, Ta, Ti, Nb, Ni, Pt, V, Hf, Pd, BN, and nitrides of W, Re, Mo, Cr, Si, Zr, Ta, Ti, Nb, V, Hf and Fe.

In the coating, spin coating may be used.

In the coating, a step of allowing a buffer layer to grow on the temporary substrate may be further included.

The buffer layer may include at least one of gallium nitride (GaN), aluminum nitride (AlN), and aluminum gallium nitride (AlGaN).

The buffer layer may be formed by hydride vapor phase epitaxy (HVPE).

The temporary substrate may include at least one of sapphire, gallium arsenide (GaAs), spinel, silicon (Si), indium phosphide (InP), and silicon carbide (SiC).

In the separating, the temporary substrate may be removed using laser lift-off (LLO).

BRIEF DESCRIPTION OF THE DRAWINGS

The above and other objects, features and other advantages of the present disclosure will be more clearly understood from the following detailed description taken in conjunction with the accompanying drawings, in which:

FIGS. 1A to 1F are sectional views illustrating a method of fabricating a gallium nitride substrate according to an embodiment of the present disclosure;

FIG. 2 is a graph illustrating a pH-dependent zeta potential change in nanoparticles with a core-shell structure manufactured by a method of fabricating a gallium nitride substrate according to an embodiment of the present disclosure;

FIGS. 3A to 3C are scanning electron microscope (SEM) images illustrating nanoparticles with a core-shell structure coated on a temporary substrate manufactured using a method of fabricating a gallium nitride substrate according to an embodiment of the present disclosure;

FIG. 4A is a scanning electron microscope-cathodoluminescence (SEM-CL) image illustrating a central portion of a gallium nitride substrate, on which nanoparticles with a core-shell structure have been grown, fabricated by a method of fabricating a gallium nitride substrate according to an embodiment of the present disclosure, as in FIG. 1F;

FIG. 4B is an SEM-CL image illustrating an edge (right) portion of a gallium nitride substrate, on which nanoparticles with a core-shell structure have been grown, fabricated by a method of fabricating a gallium nitride substrate according to an embodiment of the present disclosure, as in FIG. 1F;

FIGS. 5A to 5D are SEM images illustrating nanoparticles with a core-shell structure spin-coated using a method of fabricating a gallium nitride substrate according to an embodiment of the present disclosure;

FIG. 6A is a SEM image illustrating a surface of nanoparticles with a core-shell structure spin-coated using a method of fabricating a gallium nitride substrate according to an embodiment of the present disclosure, as in FIG. 1B;

FIG. 6B is an SEM image illustrating nanoparticles with a core-shell structure spin-coated and then thermally treated using a method of fabricating a gallium nitride substrate according to an embodiment of the present disclosure, as in FIG. 1B;

FIG. 6C illustrates a scanning electron microscope image of a surface which has been spin-coated with nanoparticles with a core-shell structure, and then has been subjected to gas ($NH_3$+HCl) injection to allow growth of an aluminum nitride layer, using the method of fabricating a gallium nitride substrate according to an embodiment of the present disclosure, as in FIG. 1D;

FIGS. 7A and 7B respectively illustrate enlarged optical microscope images of N-faces of a gallium nitride substrate allowed to grow without use of nanoparticles with a core-shell structure and a gallium nitride substrate allowed to grow using nanoparticles with a core-shell structure according to a method of fabricating a gallium nitride substrate according to an embodiment of the present disclosure;

FIGS. 7C and 7D respectively illustrate optical microscope images of N-faces of a gallium nitride substrate allowed to grow without use of nanoparticles with a core-shell structure and a gallium nitride substrate allowed to grow using nanoparticles with a core-shell structure according to a method of fabricating a gallium nitride substrate according to an embodiment of the present disclosure;

FIG. 8A is an image illustrating an edge face of a gallium nitride substrate allowed to grow without use of nanoparticles with a core-shell structure, and FIG. 8B is an image illustrating a cross section of a broken portion of a gallium nitride substrate allowed to grow without use of nanoparticles with a core-shell structure;

FIG. 8C is an image illustrating an edge face of a gallium nitride substrate allowed to grow using nanoparticles with a core-shell structure according to a method of fabricating a gallium nitride substrate according to an embodiment of the present disclosure, and FIG. 8D is an image illustrating a cross section of a broken portion of a gallium nitride substrate allowed to grow using nanoparticles with a core-shell structure according to a method of fabricating a gallium nitride substrate according to an embodiment of the present disclosure;

FIG. 9A is an optical microscope image illustrating a surface of a sapphire substrate wherein growth of a gallium nitride substrate has been allowed without use of nanoparticles with a core-shell structure and then laser lift-off (LLO) has been performed, and FIG. 9B is an optical microscope image illustrating a surface of a sapphire substrate wherein growth of a gallium nitride substrate has been allowed using nanoparticles with a core-shell structure and then LLO has been performed according to a method of fabricating a gallium nitride substrate according to an embodiment of the present disclosure;

FIG. 10A illustrates an SEM image of an interface of a gallium nitride substrate wherein growth of a gallium nitride substrate has been allowed without use of nanoparticles with a core-shell structure and then laser lift-off has been performed, thereby removing a sapphire substrate from the gallium nitride substrate;

FIG. 10B illustrates an SEM image of an interface of a gallium nitride substrate wherein growth of a gallium nitride substrate has been allowed using nanoparticles with a core-shell structure according to a method of fabricating a gallium nitride substrate according to an embodiment of the present disclosure and then laser lift-off has been performed, thereby removing a sapphire substrate from the gallium nitride substrate, as in FIG. 1E;

FIGS. 11A and 11B respectively illustrate SEM images of a central portion and edge portion of a temporary substrate of FIG. 1B wherein coating with nanoparticles with a core-shell structure have been performed once according to a method of fabricating a gallium nitride substrate according to an embodiment of the present disclosure to form a single nanoparticle layer; and FIGS. 11C and 11D respectively illustrate SEM images of a central portion and edge portion of a temporary substrate of FIG. 1B wherein coating with nanoparticles with a core-shell structure have been performed twice according to a method of fabricating a gallium nitride substrate according to an embodiment of the present disclosure to form multiple nanoparticle layers.

DETAILED DESCRIPTION OF THE DISCLOSURE

The present disclosure will now be described more fully with reference to the accompanying drawings and contents disclosed in the drawings. However, the present disclosure should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present disclosure, and it should be understood that the terms are exemplified to describe embodiments of the present disclosure.

Also, some of the terms used herein may be arbitrarily chosen by the present applicant. In this case, these terms are defined in detail below. Accordingly, the specific terms used herein should be understood based on the unique meanings thereof and the whole context of the present disclosure.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the present disclosure, a detailed description of known functions and configurations incorporated herein will be omitted when it may make the subject matter of the present disclosure unclear. The terms used in the specification are defined in consideration of functions used in the present disclosure, and can be changed according to the intent or conventionally used methods of clients, operators, and users. Accordingly, definitions of the terms should be understood on the basis of the entire description of the present specification.

Hereinafter, a method of fabricating a gallium nitride substrate according to an embodiment of the present disclosure is described in detail with reference to FIGS. 1A to 1F.

FIGS. 1A to 1F are sectional views illustrating a method of fabricating a gallium nitride substrate according to an embodiment of the present disclosure.

The method of fabricating a gallium nitride substrate according to an embodiment of the present disclosure is characterized by coating nanoparticles 120 with a core-shell structure on a temporary substrate 110 to form at least one nanoparticle layer.

Each of the nanoparticles 120 with a core-shell structure includes a core 121 and an ionic polymer shell 122 that is coated on a surface of the core 121.

In addition, since the zeta potential of the nanoparticles 120 with a core-shell structure is controlled through the ionic polymer shell 122, the nanoparticles 120 with a core-shell structure may be evenly coated on the temporary substrate 110.

Thereafter, a pit gallium nitride (GaN) layer 131 is allowed to grow on the temporary substrate 110, and a mirror gallium nitride (GaN) layer 132 is allowed to grow on the pit GaN 131, followed by removing the temporary substrate 110 therefrom.

Hereinafter, the method of fabricating a gallium nitride substrate according to an embodiment of the present disclosure is described in detail with reference to FIGS. 1A to 1F.

FIG. 1A illustrates a sectional view of the temporary substrate 110 prepared by the method of fabricating a gallium nitride substrate according to an embodiment of the present disclosure.

The zeta potential of a surface of the temporary substrate 110 may be controlled depending upon a material type or a surface treatment method (treatment with droplets, oxygen plasma treatment, or UV-ozone treatment).

In general, a zeta potential refers to a measure for electrically quantifying the degree of dispersion of particles in a solvent. In the present disclosure, the concept of the zeta potential is applied to the temporary substrate 110 as well as the nanoparticles 120, and a zeta potential of the nanoparticles 120 with a core-shell structure and a zeta potential of the temporary substrate 110 are described separately.

For example, when an acid solution (e.g., pure water with added carbon dioxide) is applied dropwise to the temporary substrate 110, a surface of the temporary substrate 110 may have a positive zeta potential. On the other hand, when an alkaline solution (e.g., SC-1) is applied dropwise to the temporary substrate 110, the surface of the temporary substrate 110 may have a negative zeta potential.

The substrate 110 may include at least one of sapphire, gallium arsenide (GaAs), spinel, silicon (Si), indium phosphide (InP), and silicon carbide (SiC).

Preferably, sapphire is used. The sapphire may have a negative zeta potential.

The aforementioned embodiment of the present disclosure has been described with regard to the temporary substrate 110 having a negative zeta potential, but the present disclosure is not limited thereto. The substrate 110 may have a positive zeta potential.

FIG. 1B illustrates a sectional view of a nanoparticle layer formed by coating the nanoparticles 120 with a core-shell structure on the temporary substrate 110 according to the method of fabricating a gallium nitride substrate according to an embodiment of the present disclosure.

FIG. 1B illustrates a technique of coating the nanoparticles 120 with a core-shell structure on the temporary substrate 110 once to form a single nanoparticle layer, but the present disclosure is not limited thereto. At least one nanoparticle layer, i.e., multiple nanoparticle layers, may be formed on the temporary substrate 110.

As illustrated in FIG. 1B, a nanoparticle layer may be formed by coating the nanoparticles 120 with a core-shell structure on the temporary substrate 110 according to the method of fabricating a gallium nitride substrate according to an embodiment of the present disclosure. Preferably, the nanoparticles 120 having a positive zeta potential may be coated on the temporary substrate 110 having a negative zeta potential to form a nanoparticle layer.

Accordingly, the nanoparticles 120 with a core-shell structure may have a zeta potential opposite to that of the temporary substrate 110. For example, when the temporary substrate 110 has a negative zeta potential, nanoparticles 120 having a positive zeta potential may be used. When the temporary substrate 110 has a positive zeta potential, nanoparticles 120 having a negative zeta potential may be used.

In addition, according to the method of fabricating a gallium nitride substrate according to an embodiment of the present disclosure, the zeta potential of the nanoparticles 120 with a core-shell structure may be controlled, thereby controlling a binding rate of the nanoparticles 120 with a core-shell structure coated on the temporary substrate 110. On the contrary, the zeta potential of the temporary substrate 110 may be controlled, thereby controlling a binding rate of the nanoparticles 120 with a core-shell structure coated on the temporary substrate 110.

For example, binding force of the nanoparticles 120 with a core-shell structure, which are coated on the temporary substrate 110, to the temporary substrate 110 may be increased by surface-treating the temporary substrate 110 having a negative zeta potential to have a higher negative zeta potential or by surface-treating the temporary substrate 110 to have a negative zeta potential and by controlling a zeta potential of the nanoparticles 120 with a core-shell structure dispersed in a solution to have a predetermined positive zeta potential. Accordingly, the surface of the temporary substrate 110 may be evenly coated with the nanoparticles 120 with a core-shell structure.

In addition, the binding force of the nanoparticles 120 with a core-shell structure, which are coated on the temporary substrate 110, to the temporary substrate 110 and a binding rate thereof may increase as a difference between the zeta potential of the temporary substrate 110 and the zeta potential of the nanoparticles 120 with a core-shell structure increases.

The nanoparticles 120 with a core-shell structure include the core 121 and the ionic polymer shell 122 coated on a surface of the core 121. The ionic polymer shell 122 may be made of a cationic or anionic polymer material.

In addition, the zeta potential of the nanoparticles 120 with a core-shell structure may be controlled by the ionic polymer shell 122.

Accordingly, a cationic or anionic polymer shell 122 is formed on a surface of the core 121 when a cationic or anionic polymer material is added to a solution containing the core 121 so as to form the nanoparticles 120 with a core-shell structure, whereby the zeta potential of the nanoparticles 120 with a core-shell structure may be finely controlled by the cationic or anionic polymer material.

For example, the surface charge of the nanoparticles 120 with a core-shell structure may be changed by an isoelectric point (IEP) that is moved from an acidic region to a neutral region by binding of a cationic polymer material to a surface of the core 121.

The cationic polymer material may move the zeta potential of the nanoparticles 120 with a core-shell structure in a positive direction, and the anionic polymer material may move the zeta potential of the nanoparticles 120 with a core-shell structure in a negative direction.

In addition, the zeta potential of the nanoparticles 120 with a core-shell structure may be controlled by pH. The zeta potential of the nanoparticles 120 with a core-shell structure may be moved in a positive direction at low pH and may be moved in a negative direction at high pH.

The cationic polymer material may include at least one of poly(diallyldimethylammonium chloride) (PDDA), polyethyleneimine (PEI), polyaniline (PANI), polyallylamine hydrochloride (PAH), polyacrylamide (PAA), polyvinylimidazole, polyamidoamine (PAMAM), polymethacryloxyethyltrialkyl ammonium halide, polyallylamine chloride, aminoethylated polyacrylamide, polyvinylamine, Hoffman-degradated polyacrylamide, and polyethyleamine.

The anionic polymer material may include at least one of polyacrylic acid, polymethacrylic acid, polystyrene (PS), polysulfonic acid, a polyacrylamide/acrylic acid copolymer, a polyacrylic acid/sulfonic acid copolymer, a polysulfonic acid/acrylamide copolymer, a polyacrylic acid/malonic acid copolymer, and a polystyrene/acrylic acid copolymer.

The core 121 may include at least one of $SiO_2$, $Al_2O_3$, $TiO_2$, $ZrO_2$, $CrO_2$, W, Re, Mo, Cr, Co, Si, Au, Zr, Ta, Ti, Nb, Ni, Pt, V, Hf, Pd, BN, and nitrides of W, Re, Mo, Cr, Si, Zr, Ta, Ti, Nb, V, Hf and Fe. Preferably, the core 121 includes silica ($SiO_2$).

The nanoparticles 120 with a core-shell structure may be formed by spin coating wherein a predetermined amount of solution is added to the temporary substrate 110 dropwise and then the temporary substrate 110 is rotated at high speed to coat the temporary substrate 110 using centrifugal force applied to the solution. By using such spin coating, production costs may be lowered compared to a deposition process. In addition, a process technique is simplified, thereby reducing fabrication costs and shortening fabrication time.

In addition, after coating the nanoparticles 120 with a core-shell structure on the temporary substrate 110 to form at least one nanoparticle layer, a buffer layer (not shown) may be allowed to grow on the temporary substrate 110. Accordingly, the buffer layer may be formed between the temporary substrate 110 and the nanoparticles 120 with a core-shell structure. The buffer layer may be formed or might not be formed according to an embodiment.

The buffer layer may serve to minimize the density of crystal defects by reducing a crystallographic difference between the temporary substrate 110, and a gallium nitride layer to be allowed to grow in a subsequent process.

Accordingly, the buffer layer is preferably made of a material that has crystal characteristics similar to those of the gallium nitride layer to be allowed to grow in a subsequent process and thus is chemically stable. Preferably, the buffer layer is preferably made of a material that has crystal characteristics, lattice constant, or coefficient of thermal expansion similar to or the same as those of the gallium nitride layer to be allowed to grow in a subsequent process. Preferably, the buffer layer may include at least one of gallium nitride (GaN), aluminum nitride (AlN), and aluminum gallium nitride (AlGaN).

In addition, the buffer layer may be formed by hydride vapor phase epitaxy (HVPE). By using HVPE, growth of a buffer layer having a lowered content of undesired impurities, compared to a conventional flux method or ammonothermal method, may be accomplished. In addition, since HVPE uses metallic gallium (Ga), as a source of gallium (Ga), and ammonia gas, as a source of nitrogen (N), it is economical compared to a metalorganic chemical vapor deposition method. In addition, since growth of the buffer layer is accomplished at a rate of 100 μm/hr or more by HVPE, the buffer layer may be formed within a short time.

FIG. 1C illustrates a sectional view of the pit GaN layer 131 allowed to grow on the temporary substrate 110 according to the method of fabricating a gallium nitride substrate according to an embodiment of the present disclosure, and FIG. 1D illustrates a sectional view of the mirror GaN layer 132 allowed to grow on the pit GaN layer 131 according to the method of fabricating a gallium nitride substrate according to an embodiment of the present disclosure.

Although FIGS. 1C and 1D illustrate the pit GaN layer 131 and the mirror GaN layer 132 that are formed by separate processes, these are provided to distinguish the characteristics of the pit GaN layer 131 and the mirror GaN layer 132 and the pit GaN layer 131 and the mirror GaN layer 132 are formed of the same material in the same chamber.

The pit GaN layer 131, which initially grows on the temporary substrate 110, is relatively more defective than the mirror GaN layer 132, and the mirror GaN layer 132 has a high-quality mirror surface.

The pit GaN layer 131 and the mirror GaN layer 132 may be allowed to grow by HVPE. By using HVPE, growth of the pit GaN layer 131 and the mirror GaN layer 132 having a lower content of undesired impurities may be accomplished, compared to a conventional flux method or ammonothermal method. In addition, since HVPE uses metallic gallium (Ga), as a source of gallium (Ga), and ammonia gas, as a source of nitrogen (N), it is economical compared to a metalorganic chemical vapor deposition method. In addition, since growth of the pit GaN layer 131 and the mirror GaN layer 132 is accomplished at a rate of 100 μm/hr or more by HVPE, the pit GaN layer 131 and the mirror GaN layer 132 may be formed within a short time.

FIG. 1E is a sectional view illustrating a process of removing the temporary substrate 110 from a gallium nitride substrate 100 according to the method of fabricating a gallium nitride substrate according to an embodiment of the present disclosure.

The temporary substrate 110 may be removed from the gallium nitride substrate 100 using at least one of an etching method, a laser lift-off (LLO) method, and a mechanical method. Preferably, the laser lift-off method is used. More preferably, the temporary substrate 110 is removed by the laser lift-off method using ultraviolet light of 355 nm.

For example, the temporary substrate 110 may be separated from the gallium nitride substrate 100 by irradiating the temporary substrate 110 with a high-power ultraviolet laser. Here, since the used ultraviolet laser has energy lower than a band gap of the temporary substrate 110 and higher than a band gap of the gallium nitride substrate 100, the ultraviolet laser passes through the temporary substrate 110 and an energy of the ultraviolet laser is applied to an interface of the gallium nitride substrate 100 when the temporary substrate 110 is irradiated with the ultraviolet laser.

Accordingly, the ultraviolet laser momentarily melts an interface between the temporary substrate 110 and the gallium nitride substrate 100, whereby the temporary substrate 110 is separated from the gallium nitride substrate 100. By the process of separating the temporary substrate 110, a residual material may remain at the interface between the temporary substrate 110 and the gallium nitride substrate 100. Such a residual material may be removed by, e.g., an etching method.

FIG. 1F illustrates a sectional view of the gallium nitride substrate 100 fabricated by the method of fabricating a gallium nitride substrate according to an embodiment of the present disclosure.

The gallium nitride substrate 100 fabricated by the method of fabricating a gallium nitride substrate according to an embodiment of the present disclosure may include the nanoparticles 120 with a core-shell structure and a gallium nitride layer 130 including the pit GaN layer 131 and the mirror GaN layer 132.

Since the gallium nitride substrate 100 according to the method of fabricating a gallium nitride substrate according to an embodiment of the present disclosure is fabricated by selective growth of the gallium nitride layer 130 on the temporary substrate 110 using the nanoparticles 120 with a core-shell structure, a growth process may be simplified and a growth time of the gallium nitride layer 130 may be shortened.

In addition, since the gallium nitride substrate 100 according to the method of fabricating a gallium nitride substrate according to an embodiment of the present disclosure is fabricated by selective growth of the gallium nitride layer 130 on the temporary substrate 110 using the nanoparticles 120 with a core-shell structure, the defect density of the gallium nitride layer 130 may be decreased.

Further, since the gallium nitride substrate 100 fabricated by the method of fabricating a gallium nitride substrate according to an embodiment of the present disclosure controls the zeta potential of the nanoparticles 120 with a core-shell structure using the ionic polymer shell 122, the nanoparticles 120 with a core-shell structure may be evenly coated on the temporary substrate 110.

Hereinafter, the characteristics of the gallium nitride substrate 100 fabricated by the method of fabricating a gallium nitride substrate according to an embodiment of the present disclosure are described in detail with reference to FIGS. 2 to 11D.

FIG. 2 is a graph illustrating a pH-dependent zeta potential change in nanoparticles with a core-shell structure manufactured by the method of fabricating a gallium nitride substrate according to an embodiment of the present disclosure.

Referring to FIG. 2, a sapphire substrate (temporary substrate) has a negative zeta potential, and silica (PL-7) nanoparticles have a positive zeta potential. However, since the zeta potential of the silica (PL-7) nanoparticles is insufficient to provide even distribution on the sapphire substrate, the silica (PL-7) nanoparticles are non-uniformly coated on the sapphire substrate.

However, since the zeta potential of the nanoparticles (silica+positive charge polymer) with a core-shell structure manufactured by the method of fabricating a gallium nitride substrate according to an embodiment of the present disclosure moves in a positive direction by a cationic polymer material, the nanoparticles (silica+positive charge polymer) with a core-shell structure may be evenly coated on a sapphire substrate.

FIGS. 3A to 3C are scanning electron microscope (SEM) images illustrating nanoparticles with a core-shell structure coated on a temporary substrate manufactured using the method of fabricating a gallium nitride substrate according to an embodiment of the present disclosure.

FIG. 3A illustrates an image obtained after spin-coating the nanoparticles with a core-shell structure on the temporary substrate according to the method of fabricating a gallium nitride substrate according to an embodiment of the present disclosure, as in FIG. 1B.

FIG. 3B illustrates an image obtained after allowing a buffer layer to grow between the nanoparticles with a core-shell structure and the temporary substrate according to the method of fabricating a gallium nitride substrate according to an embodiment of the present disclosure.

FIG. 3C is an image illustrating an interface of the gallium nitride substrate after removing the temporary substrate using ultraviolet laser lift-off according to the method of fabricating a gallium nitride substrate according to an embodiment of the present disclosure, as in FIG. 1E.

Referring to FIGS. 3A to 3C, it can be confirmed that the nanoparticles with a core-shell structure are evenly formed on the temporary substrate.

FIG. 4A is a scanning electron microscope-cathodoluminescence (SEM-CL) image illustrating a central portion of a gallium nitride substrate, on which nanoparticles with a core-shell structure have been grown, fabricated by the method of fabricating a gallium nitride substrate according to an embodiment of the present disclosure, as in FIG. 1F.

FIG. 4B is an SEM-CL image illustrating an edge (right) portion of a gallium nitride substrate, on which nanoparticles with a core-shell structure have been grown, fabricated by the method of fabricating a gallium nitride substrate according to an embodiment of the present disclosure, as in FIG. 1F.

A threading dislocation density (TDD) of the central portion of the gallium nitride substrate formed through growth of the nanoparticles with a core-shell structure according to the method of fabricating a gallium nitride substrate according to an embodiment of the present disclosure was $4.88 \times 10^6$ cm$^{-2}$, and the TDD of the edge (right) portion thereof was $4.22 \times 10^6$ cm$^{-2}$.

Accordingly, referring to FIGS. 4A and 4B, it can be confirmed that, when growth of a gallium nitride substrate is accomplished using the nanoparticles with a core-shell structure according to the method of fabricating a gallium nitride substrate according to an embodiment of the present disclosure, a threading dislocation density difference between the central portion of the gallium nitride substrate and the edge portion thereof is decreased. This result indicates that the nanoparticles with a core-shell structure are evenly coated and the growth of gallium nitride is satisfactorily accomplished.

FIGS. 5A to 5D are SEM images illustrating nanoparticles with a core-shell structure spin-coated using the method of fabricating a gallium nitride substrate according to an embodiment of the present disclosure.

FIG. 5A illustrates an SEM image obtained after spin-coating the nanoparticles with a core-shell structure at a rotational speed of 1500 rpm, FIG. 5B illustrates an enlarged SEM image obtained after spin-coating the nanoparticles with a core-shell structure at a rotational speed of 1500 rpm, FIG. 5C illustrates an SEM image obtained after spin-coating the nanoparticles with a core-shell structure at a rotational speed of 2500 rpm, and FIG. 5D illustrates an enlarged SEM image obtained after spin-coating the nanoparticles with a core-shell structure at a rotational speed of 2500 rpm.

Referring to FIGS. 5A to 5D, it can be confirmed that the nanoparticles with a core-shell structure are evenly coated on the temporary substrate.

FIG. 6A is a SEM image illustrating a surface of nanoparticles with a core-shell structure spin-coated using the method of fabricating a gallium nitride substrate according to an embodiment of the present disclosure, as in FIG. 1B.

Referring to FIG. 6A, a sapphire substrate separated after the growth of gallium nitride was recycled, and the nanoparticles with a core-shell structure were spin-coated thereon.

FIG. 6B is an SEM image illustrating nanoparticles with a core-shell structure spin-coated and then thermally treated using the method of fabricating a gallium nitride substrate according to an embodiment of the present disclosure, as in FIG. 1B.

Referring to FIG. 6B, heat treatment was performed at 990° C. immediately before growth of gallium nitride so as to, after spin-coating the nanoparticles with a core-shell structure on a surface of the recycled sapphire substrate, perform a temperature stability test therefor.

FIG. 6C illustrates a scanning electron microscope image of a surface which has been spin-coated with nanoparticles with a core-shell structure, and then has been subjected to gas ($NH_3$+HCl) injection to allow growth of an aluminum nitride layer, using the method of fabricating a gallium nitride substrate according to an embodiment of the present disclosure, as in FIG. 1D.

Referring to FIG. 6C, ammonia ($NH_3$) gas was injected for 1 minute, hydrogen chloride (HCl) gas was injected for 5 minutes, and ammonia ($NH_3$) gas was injected for 2 minutes, so that growth of an aluminum nitride layer was accomplished.

Referring to FIG. 6C, an aluminum nitride layer was allowed to grow after spin-coating the nanoparticles with a core-shell structure on a surface of the recycled sapphire substrate so as to perform a gas stability test.

Referring to FIGS. 6A to 6C, the nanoparticles with a core-shell structure were not deformed or removed after the heat treatment and the gas injection. From this result, it can be confirmed that the nanoparticles with a core-shell structure are stable with respect to high temperature and reaction with gas.

FIGS. 7A and 7B respectively illustrate enlarged optical microscope images of N-faces of a gallium nitride substrate allowed to grow without use of nanoparticles with a core-shell structure and a gallium nitride substrate allowed to grow using nanoparticles with a core-shell structure according to the method of fabricating a gallium nitride substrate according to an embodiment of the present disclosure.

FIGS. 7C and 7D respectively illustrate optical microscope images of N-faces of a gallium nitride substrate allowed to grow without use of nanoparticles with a core-shell structure and a gallium nitride substrate allowed to grow using nanoparticles with a core-shell structure according to the method of fabricating a gallium nitride substrate according to an embodiment of the present disclosure.

In the N-faces illustrated in FIGS. 7A to 7D, three strong bonds between gallium (Ga) atoms of gallium nitride and three neighboring nitrogen (N) atoms nearest the Ga atoms are directed upward in a growth direction.

Referring to FIGS. 7A to 7D, it can be confirmed that the N-face of the gallium nitride substrate allowed to grow using the nanoparticles with a core-shell structure according to the method of fabricating a gallium nitride substrate according to an embodiment of the present disclosure is more uniform and exhibits a decrease in crack generation, which is caused by separation using laser, compared to the gallium nitride substrate allowed to grow without use of the nanoparticles with a core-shell structure.

FIG. 8A is an image illustrating an edge face of a gallium nitride substrate allowed to grow without use of nanoparticles with a core-shell structure, and FIG. 8B is an image illustrating a cross section of a broken portion of a gallium nitride substrate allowed to grow without use of nanoparticles with a core-shell structure.

FIG. 8C is an image illustrating an edge face of a gallium nitride substrate allowed to grow using nanoparticles with a core-shell structure according to the method of fabricating a gallium nitride substrate according to an embodiment of the present disclosure, and FIG. 8D is an image illustrating a cross section of a broken portion of a gallium nitride substrate allowed to grow using nanoparticles with a core-shell structure according to the method of fabricating a gallium nitride substrate according to an embodiment of the present disclosure.

Referring to FIGS. 8A to 8D, it can be confirmed that surfaces of an edge face and broken portion of the gallium nitride substrate allowed to grow using the nanoparticles with a core-shell structure according to the method of fabricating a gallium nitride substrate according to an embodiment of the present disclosure are smoother than those of the gallium nitride substrate allowed to grow without use of the nanoparticles with a core-shell structure.

FIG. 9A is an optical microscope image illustrating a surface of a sapphire substrate wherein growth of a gallium nitride substrate has been allowed without use of nanoparticles with a core-shell structure and then laser lift-off (LLO) has been performed, and FIG. 9B is an optical microscope image illustrating a surface of a sapphire substrate wherein growth of a gallium nitride substrate has been allowed using nanoparticles with a core-shell structure and then LLO has been performed according to the method of fabricating a gallium nitride substrate according to an embodiment of the present disclosure.

Referring to FIGS. 9A and 9B, it can be confirmed that a surface of the sapphire substrate of the gallium nitride substrate allowed to grow using the nanoparticles with a core-shell structure according to the method of fabricating a gallium nitride substrate according to an embodiment of the present disclosure is not different from that of the gallium nitride substrate allowed to grow without use of the nanoparticles with a core-shell structure.

FIG. 10A illustrates an SEM image of an interface of a gallium nitride substrate wherein growth of a gallium nitride substrate has been allowed without use of nanoparticles with a core-shell structure and then laser lift-off has been performed, thereby removing a sapphire substrate from the gallium nitride substrate.

FIG. 10B illustrates an SEM image of an interface of a gallium nitride substrate wherein growth of a gallium nitride substrate has been allowed using nanoparticles with a core-shell structure according to the method of fabricating a gallium nitride substrate according to an embodiment of the present disclosure and then laser lift-off has been performed, thereby removing a sapphire substrate from the gallium nitride substrate, as in FIG. 1E.

Referring to FIGS. 10A and 10B, it can be confirmed that a gallium nitride substrate interface, which has been obtained after allowing growth of the gallium nitride substrate using the nanoparticles with a core-shell structure and then removing the sapphire substrate by laser lift-off according to the method of fabricating a gallium nitride substrate according to an embodiment of the present disclosure, is coated with nanoparticles with a core-shell structure.

FIGS. 11A and 11B respectively illustrate SEM images of a central portion and edge portion of a temporary substrate of FIG. 1B wherein coating with nanoparticles with a core-shell structure has been performed once according to the method of fabricating a gallium nitride substrate according to an embodiment of the present disclosure to form a single nanoparticle layer.

FIGS. 11C and 11D respectively illustrate SEM images of a central portion and an edge portion of a temporary substrate of FIG. 1B wherein coating with nanoparticles with a core-shell structure has been performed twice according to the method of fabricating a gallium nitride substrate according to an embodiment of the present disclosure to form multiple nanoparticle layers.

Referring to FIGS. 11A to 11D, it can be confirmed that, when the multiple nanoparticle layers are formed, the nanoparticles with a core-shell structure are more evenly densified on a central portion and edge portion of the temporary substrate, compared to the case in which the single nanoparticle layer is formed.

According to an embodiment of the present disclosure, a growth process can be simplified and a gallium nitride layer growth time can be shortened by allowing a gallium nitride layer to selectively grow on a temporary substrate using nanoparticles with a core-shell structure.

According to an embodiment of the present disclosure, a defect density of a grown gallium nitride layer can be reduced by allowing a gallium nitride layer to selectively grow on a temporary substrate using nanoparticles with a core-shell structure.

According to an embodiment of the present disclosure, a temporary substrate can be evenly coated with nanoparticles with a core-shell structure.

Further, according to an embodiment of the present disclosure, a temporary substrate can be evenly coated with nanoparticles with a core-shell structure by controlling the zeta potential of the nanoparticles using an ionic polymer shell.

According to an embodiment of the present disclosure, fabrication costs and time can be reduced by coating nanoparticles with a core-shell structure on a temporary substrate using spin coating and thus simplifying a coating process.

Although the present disclosure has been described through limited examples and figures, the present disclosure is not intended to be limited to the examples. Those skilled in the art will appreciate that various modifications, additions, and substitutions are possible, without departing from the scope and spirit of the disclosure.

Therefore, it should be understood that there is no intent to limit the disclosure to the embodiments disclosed herein, rather, the disclosure is to cover all modifications, equivalents, and alternatives falling within the spirit and scope of the disclosure as defined by the claims.

DESCRIPTION OF SYMBOLS

100: GALLIUM NITRIDE SUBSTRATE
110: TEMPORARY SUBSTRATE
120: NANOPARTICLE WITH CORE-SHELL STRUCTURE
121: CORE
122: SHELL
130: GALLIUM NITRIDE LAYER
131: PIT GALLIUM NITRIDE LAYER
132: MIRROR GALLIUM NITRIDE LAYER

What is claimed is:

1. A method of fabricating a gallium nitride substrate, the method comprising:
coating nanoparticles with a core-shell structure on a temporary substrate to form at least one nanoparticle layer;
allowing a pit gallium nitride (pit GaN) layer to grow on the temporary substrate;
allowing a mirror GaN layer (mirror GaN) to grow on the pit GaN layer; and
separating the temporary substrate,
wherein each of the nanoparticles with a core-shell structure comprises a core and an ionic polymer shell coated on a surface of the core surface.

2. The method according to claim 1, wherein a zeta potential of the nanoparticles with a core-shell structure is controlled by the shell.

3. The method according to claim 2, wherein the nanoparticles with a core-shell structure have a zeta potential opposite to that of the temporary substrate.

4. The method according to claim 1, wherein the ionic polymer shell is made of a cationic polymer material, the cationic polymer material comprising at least one of poly (diallyldimethylammonium chloride) (PDDA), polyethyleneimine (PEI), polyaniline (PANI), polyallylamine hydrochloride (PAH), polyacrylamide (PAA), polyvinylimidazole, polyamidoamine (PAMAM), polymethacryloxyethyltrialkyl ammonium halide, polyallylamine chloride, aminoethylated polyacrylamide, polyvinylamine, Hoffman-degradated polyacrylamide, and polyethyleamine.

5. The method according to claim 1, wherein the ionic polymer shell is made of an anionic polymer material, the anionic polymer material comprising at least one of polyacrylic acid, polymethacrylic acid, polystyrene (PS), polysulfonic acid, a polyacrylamide/acrylic acid copolymer, a polyacrylic acid/sulfonic acid copolymer, a polysulfonic acid/acrylamide copolymer, a polyacrylic acid/malonic acid copolymer, and a polystyrene/acrylic acid copolymer.

6. The method according to claim 1, wherein the core comprises at least one of $SiO_2$, $Al_2O_3$, $TiO_2$, $ZrO_2$, $CrO_2$, W, Re, Mo, Cr, Co, Si, Au, Zr, Ta, Ti, Nb, Ni, Pt, V, Hf, Pd, BN, and nitrides of W, Re, Mo, Cr, Si, Zr, Ta, Ti, Nb, V, Hf and Fe.

7. The method according to claim 1, wherein, in the coating, spin coating is used.

8. The method according to claim 1, wherein, in the coating, allowing a buffer layer to grow on the temporary substrate is further comprised.

9. The method according to claim 8, wherein the buffer layer comprises at least one of gallium nitride (GaN), aluminum nitride (AlN), and aluminum gallium nitride (AlGaN).

10. The method according to claim 8, wherein the buffer layer is formed by hydride vapor phase epitaxy (HVPE).

11. The method according to claim 1, wherein the temporary substrate comprises at least one of sapphire, gallium arsenide (GaAs), spinel, silicon (Si), indium phosphide (InP), and silicon carbide (SiC).

12. The method according to claim 1, wherein, in the separating, the temporary substrate is removed using laser lift-off (LLO).

* * * * *